(12) United States Patent
Tawashi et al.

(10) Patent No.: US 12,345,826 B2
(45) Date of Patent: Jul. 1, 2025

(54) ADAPTIVE OSCILLATOR FREQUENCY ERROR ESTIMATION BASED ON OSCILLATOR TEMPERATURE NOISE LEVEL

(71) Applicant: QUALCOMM Incorporated, San Diego, CA (US)

(72) Inventors: Mohammed Tawashi, San Diego, CA (US); Jordan Cookman, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 401 days.

(21) Appl. No.: 17/820,426

(22) Filed: Aug. 17, 2022

(65) Prior Publication Data

US 2024/0061062 A1     Feb. 22, 2024

(51) Int. Cl.
*G01S 5/00*     (2006.01)
*G01S 5/02*     (2010.01)

(52) U.S. Cl.
CPC .......... *G01S 5/0036* (2013.01); *G01S 5/0236* (2013.01)

(58) Field of Classification Search
CPC ....... G01S 5/0036; G01S 5/0236; H03L 1/026
USPC ................. 331/158, 176; 455/76; 375/375
See application file for complete search history.

(56) References Cited

U.S. PATENT DOCUMENTS 8,643,444 B2 *   2/2014   He ..................... H03L 1/022
                                                 331/158
2017/0288679 A1  10/2017  Bryant et al.

OTHER PUBLICATIONS

International Search Report and Written Opinion—PCT/US2023/069873—ISA/EPO—Oct. 19, 2023.
Yang Z., et al., "Temperature-Assisted Clock Synchronization and Self-Calibration for Sensor Networks", IEEE Transactions on Wireless Communications, IEEE Service Center, Piscataway, NJ, US, vol. 13, No. 6, Jun. 1, 2014, pp. 3419-3429, XP011551733, section III.

* cited by examiner

*Primary Examiner* — Arnold M Kinkead
(74) *Attorney, Agent, or Firm* — Muncy, Geissler, Olds & Lowe, P.C.

(57) ABSTRACT

Disclosed are techniques for oscillator frequency error estimation. In an aspect, an electronic device receives, from a power management integrated circuit (PMIC), a plurality of temperature measurements of an oscillator of the electronic device, determines a temperature noise level estimate of the oscillator based on the plurality of temperature measurements, determines, based on the temperature noise level estimate, a set of parameters for determining a frequency error estimate of the oscillator, and determines the frequency error estimate of the oscillator based on the set of parameters.

40 Claims, 6 Drawing Sheets

ADAPTIVE OSCILLATOR FREQUENCY ERROR ESTIMATION BASED ON OSCILLATOR TEMPERATURE NOISE LEVEL

BACKGROUND OF THE DISCLOSURE

1. Field of the Disclosure

Aspects of the disclosure relate generally to wireless communications.

2. Description of the Related Art

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service and a fourth-generation (4G) service (e.g., Long Term Evolution (LTE) or WiMax). There are presently many different types of wireless communication systems in use, including cellular and personal communications service (PCS) systems. Examples of known cellular systems include the cellular analog advanced mobile phone system (AMPS), and digital cellular systems based on code division multiple access (CDMA), frequency division multiple access (FDMA), time division multiple access (TDMA), the Global System for Mobile communications (GSM), etc.

A fifth generation (5G) wireless standard, referred to as New Radio (NR), enables higher data transfer speeds, greater numbers of connections, and better coverage, among other improvements. The 5G standard, according to the Next Generation Mobile Networks Alliance, is designed to provide higher data rates as compared to previous standards, more accurate positioning (e.g., based on reference signals for positioning (RS-P), such as downlink, uplink, or sidelink positioning reference signals (PRS)), and other technical enhancements. These enhancements, as well as the use of higher frequency bands, advances in PRS processes and technology, and high-density deployments for 5G, enable highly accurate 5G-based positioning.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a method of oscillator frequency error estimation performed by an electronic device includes receiving, from a power management integrated circuit (PMIC), a plurality of temperature measurements of an oscillator of the electronic device; determining a temperature noise level estimate of the oscillator based on the plurality of temperature measurements; determining, based on the temperature noise level estimate, a set of parameters for determining a frequency error estimate of the oscillator; and determining the frequency error estimate of the oscillator based on the set of parameters.

In an aspect, an electronic device includes a memory; at least one transceiver; and at least one processor communicatively coupled to the memory and the at least one transceiver, the at least one processor configured to: receive, via the at least one transceiver, from a power management integrated circuit (PMIC), a plurality of temperature measurements of an oscillator of the electronic device; determine a temperature noise level estimate of the oscillator based on the plurality of temperature measurements; determine, based on the temperature noise level estimate, a set of parameters for determining a frequency error estimate of the oscillator; and determine the frequency error estimate of the oscillator based on the set of parameters.

In an aspect, an electronic device includes means for receiving, from a power management integrated circuit (PMIC), a plurality of temperature measurements of an oscillator of the electronic device; means for determining a temperature noise level estimate of the oscillator based on the plurality of temperature measurements; means for determining, based on the temperature noise level estimate, a set of parameters for determining a frequency error estimate of the oscillator; and means for determining the frequency error estimate of the oscillator based on the set of parameters.

In an aspect, a non-transitory computer-readable medium stores computer-executable instructions that, when executed by an electronic device, cause the electronic device to: receive, from a power management integrated circuit (PMIC), a plurality of temperature measurements of an oscillator of the electronic device; determine a temperature noise level estimate of the oscillator based on the plurality of temperature measurements; determine, based on the temperature noise level estimate, a set of parameters for determining a frequency error estimate of the oscillator; and determine the frequency error estimate of the oscillator based on the set of parameters.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Figure 1:
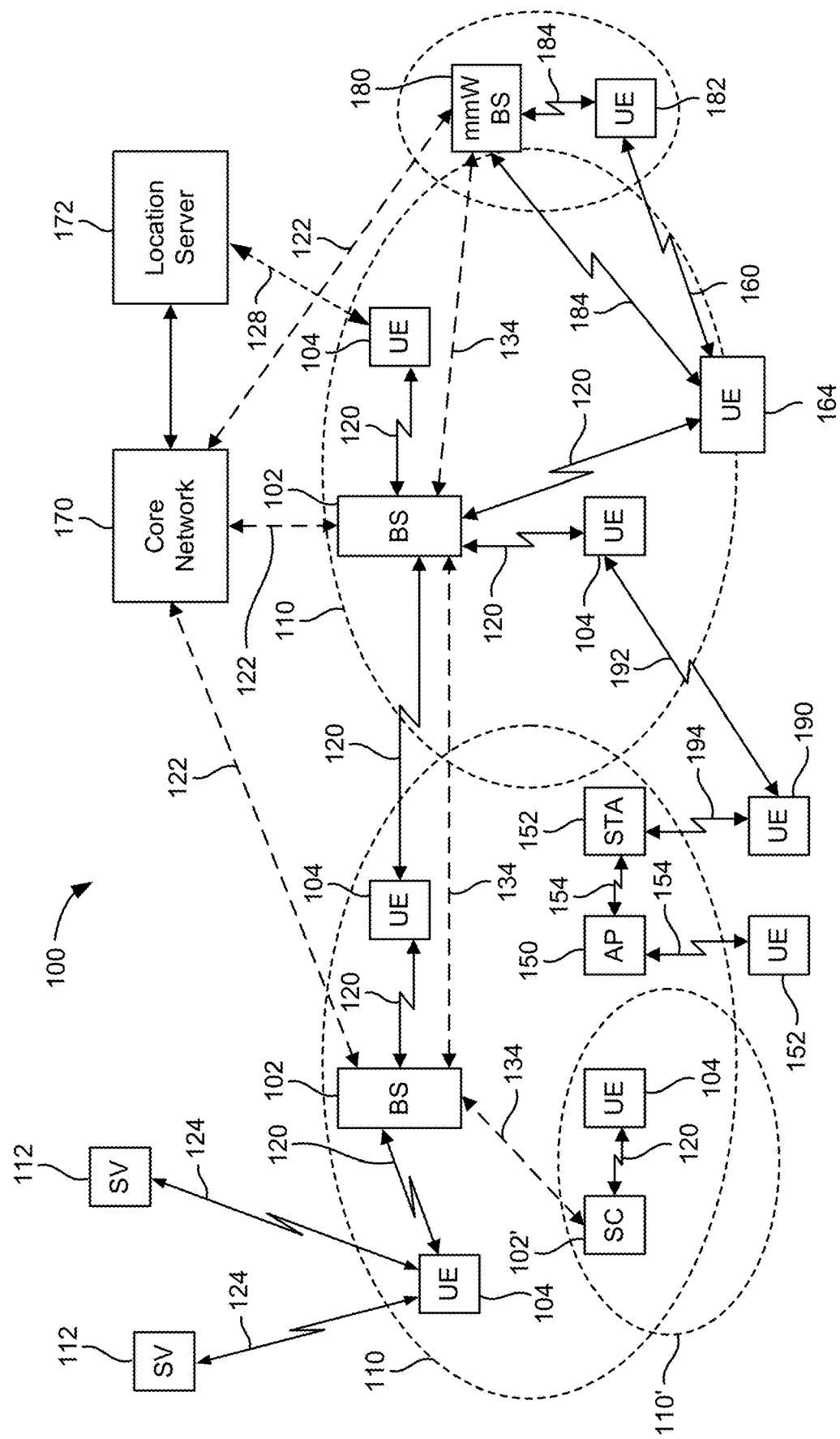
FIG. 1 illustrates an example wireless communications system, according to aspects of the disclosure.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

As used herein, the terms "user equipment" (UE) and "base station" are not intended to be specific or otherwise limited to any particular radio access technology (RAT), unless otherwise noted. In general, a UE may be any wireless communication device (e.g., a mobile phone, router, tablet computer, laptop computer, consumer asset locating device, wearable (e.g., smartwatch, glasses, augmented reality (AR)/virtual reality (VR) headset, etc.), vehicle (e.g., automobile, motorcycle, bicycle, etc.), Internet of Things (IoT) device, etc.) used by a user to communicate over a wireless communications network. A UE may be mobile or may (e.g., at certain times) be stationary, and may communicate with a radio access network (RAN). As used herein, the term "UE" may be referred to interchangeably as an "access terminal" or "AT," a "client device," a "wireless device," a "subscriber device," a "subscriber terminal," a "subscriber station," a "user terminal" or "UT," a "mobile device," a "mobile terminal," a "mobile station," or variations thereof.

Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, wireless local area network (WLAN) networks (e.g., based on the Institute of Electrical and Electronics Engineers (IEEE) 802.11 specification, etc.) and so on.

A base station may operate according to one of several RATs in communication with UEs depending on the network in which it is deployed, and may be alternatively referred to as an access point (AP), a network node, a NodeB, an evolved NodeB (eNB), a next generation eNB (ng-eNB), a New Radio (NR) Node B (also referred to as a gNB or gNodeB), etc. A base station may be used primarily to support wireless access by UEs, including supporting data, voice, and/or signaling connections for the supported UEs. In some systems a base station may provide purely edge node signaling functions while in other systems it may provide additional control and/or network management functions.

A communication link through which UEs can send signals to a base station is called an uplink (UL) channel (e.g., a reverse traffic channel, a reverse control channel, an access channel, etc.). A communication link through which the base station can send signals to UEs is called a downlink (DL) or forward link channel (e.g., a paging channel, a control channel, a broadcast channel, a forward traffic channel, etc.). As used herein the term traffic channel (TCH) can refer to either an uplink/reverse or downlink/forward traffic channel.

The term "base station" may refer to a single physical transmission-reception point (TRP) or to multiple physical TRPs that may or may not be co-located. For example, where the term "base station" refers to a single physical TRP, the physical TRP may be an antenna of the base station corresponding to a cell (or several cell sectors) of the base station.

Where the term "base station" refers to multiple co-located physical TRPs, the physical TRPs may be an array of antennas (e.g., as in a multiple-input multiple-output (MIMO) system or where the base station employs beamforming) of the base station. Where the term "base station" refers to multiple non-co-located physical TRPs, the physical TRPs may be a distributed antenna system (DAS) (a network of spatially separated antennas connected to a common source via a transport medium) or a remote radio head (RRH) (a remote base station connected to a serving base station). Alternatively, the non-co-located physical TRPs may be the serving base station receiving the measurement report from the UE and a neighbor base station whose reference radio frequency (RF) signals the UE is measuring. Because a TRP is the point from which a base station transmits and receives wireless signals, as used herein, references to transmission from or reception at a base station are to be understood as referring to a particular TRP of the base station.

In some implementations that support positioning of UEs, a base station may not support wireless access by UEs (e.g., may not support data, voice, and/or signaling connections for UEs), but may instead transmit reference signals to UEs to be measured by the UEs, and/or may receive and measure signals transmitted by the UEs. Such a base station may be referred to as a positioning beacon (e.g., when transmitting signals to UEs) and/or as a location measurement unit (e.g., when receiving and measuring signals from UEs).

An "RF signal" comprises an electromagnetic wave of a given frequency that transports information through the space between a transmitter and a receiver. As used herein, a transmitter may transmit a single "RF signal" or multiple "RF signals" to a receiver.

However, the receiver may receive multiple "RF signals" corresponding to each transmitted RF signal due to the propagation characteristics of RF signals through multipath channels. The same transmitted RF signal on different paths between the transmitter and receiver may be referred to as a "multipath" RF signal. As used herein, an RF signal may also be referred to as a "wireless signal" or simply a "signal" where it is clear from the context that the term "signal" refers to a wireless signal or an RF signal.

FIG. 1 illustrates an example wireless communications system 100, according to aspects of the disclosure. The wireless communications system 100 (which may also be referred to as a wireless wide area network (WWAN)) may include various base stations 102 (labeled "BS") and various UEs 104. The base stations 102 may include macro cell base stations (high power cellular base stations) and/or small cell base stations (low power cellular base stations). In an aspect, the macro cell base stations may include eNBs and/or ng-eNBs where the wireless communications system 100 corresponds to an LTE network, or gNBs where the wireless communications system 100 corresponds to a NR network, or a combination of both, and the small cell base stations may include femtocells, picocells, microcells, etc.

The base stations 102 may collectively form a RAN and interface with a core network 170 (e.g., an evolved packet core (EPC) or a 5G core (5GC)) through backhaul links 122, and through the core network 170 to one or more location servers 172 (e.g., a location management function (LMF) or a secure user plane location (SUPL) location platform (SLP)). The location server(s) 172 may be part of core network 170 or may be external to core network 170. A location server 172 may be integrated with a base station 102. A UE 104 may communicate with a location server 172 directly or indirectly. For example, a UE 104 may communicate with a location server 172 via the base station 102 that is currently serving that UE 104. A UE 104 may also communicate with a location server 172 through another path, such as via an application server (not shown), via another network, such as via a wireless local area network (WLAN) access point (AP) (e.g., AP 150 described below), and so on. For signaling purposes, communication between a UE 104 and a location server 172 may be represented as an indirect connection (e.g., through the core network 170, etc.) or a direct connection (e.g., as shown via direct connection 128), with the intervening nodes (if any) omitted from a signaling diagram for clarity.

In addition to other functions, the base stations 102 may perform functions that relate to one or more of transferring user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, RAN sharing, multimedia broadcast multicast service (MBMS), subscriber and equipment trace, RAN information management (RIM), paging, positioning, and delivery of warning messages. The base stations 102 may communicate with each other directly or indirectly (e.g., through the EPC/5GC) over backhaul links 134, which may be wired or wireless.

The base stations 102 may wirelessly communicate with the UEs 104. Each of the base stations 102 may provide communication coverage for a respective geographic coverage area 110. In an aspect, one or more cells may be supported by a base station 102 in each geographic coverage area 110. A "cell" is a logical communication entity used for communication with a base station (e.g., over some frequency resource, referred to as a carrier frequency, component carrier, carrier, band, or the like), and may be associated with an identifier (e.g., a physical cell identifier (PCI), an enhanced cell identifier (ECI), a virtual cell identifier (VCI), a cell global identifier (CGI), etc.) for distinguishing cells operating via the same or a different carrier frequency. In some cases, different cells may be configured according to different protocol types (e.g., machine-type communication (MTC), narrowband IoT (NB-IoT), enhanced mobile broadband (eMBB), or others) that may provide access for different types of UEs. Because a cell is supported by a specific base station, the term "cell" may refer to either or both of the logical communication entity and the base station that supports it, depending on the context. In addition, because a TRP is typically the physical transmission point of a cell, the terms "cell" and "TRP" may be used interchangeably. In some cases, the term "cell" may also refer to a geographic coverage area of a base station (e.g., a sector), insofar as a carrier frequency can be detected and used for communication within some portion of geographic coverage areas 110.

While neighboring macro cell base station 102 geographic coverage areas 110 may partially overlap (e.g., in a handover region), some of the geographic coverage areas 110 may be substantially overlapped by a larger geographic coverage area 110. For example, a small cell base station 102' (labeled "SC" for "small cell") may have a geographic coverage area 110' that substantially overlaps with the geographic coverage area 110 of one or more macro cell base stations 102. A network that includes both small cell and macro cell base stations may be known as a heterogeneous network. A heterogeneous network may also include home eNBs (HeNBs), which may provide service to a restricted group known as a closed subscriber group (CSG).

The communication links 120 between the base stations 102 and the UEs 104 may include uplink (also referred to as reverse link) transmissions from a UE 104 to a base station 102 and/or downlink (DL) (also referred to as forward link) transmissions from a base station 102 to a UE 104. The communication links 120 may use MIMO antenna technology, including spatial multiplexing, beamforming, and/or transmit diversity. The communication links 120 may be through one or more carrier frequencies. Allocation of carriers may be asymmetric with respect to downlink and uplink (e.g., more or less carriers may be allocated for downlink than for uplink).

The wireless communications system 100 may further include a wireless local area network (WLAN) access point (AP) 150 in communication with WLAN stations (STAs) 152 via communication links 154 in an unlicensed frequency spectrum (e.g., 5 GHz).

When communicating in an unlicensed frequency spectrum, the WLAN STAs 152 and/or the WLAN AP 150 may perform a clear channel assessment (CCA) or listen before talk (LBT) procedure prior to communicating in order to determine whether the channel is available.

The small cell base station 102' may operate in a licensed and/or an unlicensed frequency spectrum. When operating in an unlicensed frequency spectrum, the small cell base station 102' may employ LTE or NR technology and use the same 5 GHz unlicensed frequency spectrum as used by the WLAN AP 150. The small cell base station 102', employing LTE/5G in an unlicensed frequency spectrum, may boost coverage to and/or increase capacity of the access network. NR in unlicensed spectrum may be referred to as NR-U. LTE in an unlicensed spectrum may be referred to as LTE-U, licensed assisted access (LAA), or MulteFire.

The wireless communications system 100 may further include a millimeter wave (mmW) base station 180 that may operate in mmW frequencies and/or near mmW frequencies in communication with a UE 182. Extremely high frequency (EHF) is part of the RF in the electromagnetic spectrum. EHF has a range of 30 GHz to 300 GHz and a wavelength between 1 millimeter and 10 millimeters. Radio waves in this band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band have high path loss and a relatively short range. The mmW base station 180 and the UE 182 may utilize beamforming (transmit and/or receive) over a mmW communication link 184 to compensate for the extremely high path loss and short range. Further, it will be appreciated that in alternative configurations, one or more base stations 102 may also transmit using mmW or near mmW and beamforming. Accordingly, it will be appreciated that the foregoing illustrations are merely examples and should not be construed to limit the various aspects disclosed herein.

Transmit beamforming is a technique for focusing an RF signal in a specific direction. Traditionally, when a network node (e.g., a base station) broadcasts an RF signal, it broadcasts the signal in all directions (omni-directionally). With transmit beamforming, the network node determines where a given target device (e.g., a UE) is located (relative to the transmitting network node) and projects a stronger downlink RF signal in that specific direction, thereby providing a faster (in terms of data rate) and stronger RF signal for the receiving device(s). To change the directionality of the RF signal when transmitting, a network node can control the phase and relative amplitude of the RF signal at each of the one or more transmitters that are broadcasting the RF signal. For example, a network node may use an array of antennas (referred to as a "phased array" or an "antenna array") that creates a beam of RF waves that can be "steered" to point in different directions, without actually moving the antennas. Specifically, the RF current from the transmitter is fed to the individual antennas with the correct phase relationship so that the radio waves from the separate antennas add together to increase the radiation in a desired direction, while cancelling to suppress radiation in undesired directions.

Transmit beams may be quasi-co-located, meaning that they appear to the receiver (e.g., a UE) as having the same parameters, regardless of whether or not the transmitting antennas of the network node themselves are physically co-located. In NR, there are four types of quasi-co-location (QCL) relations. Specifically, a QCL relation of a given type means that certain parameters about a second reference RF signal on a second beam can be derived from information about a source reference RF signal on a source beam. Thus, if the source reference RF signal is QCL Type A, the receiver can use the source reference RF signal to estimate the Doppler shift, Doppler spread, average delay, and delay spread of a second reference RF signal transmitted on the same channel. If the source reference RF signal is QCL Type B, the receiver can use the source reference RF signal to estimate the Doppler shift and Doppler spread of a second reference RF signal transmitted on the same channel. If the source reference RF signal is QCL Type C, the receiver can use the source reference RF signal to estimate the Doppler shift and average delay of a second reference RF signal transmitted on the same channel. If the source reference RF signal is QCL Type D, the receiver can use the source reference RF signal to estimate the spatial receive parameter of a second reference RF signal transmitted on the same channel.

In receive beamforming, the receiver uses a receive beam to amplify RF signals detected on a given channel. For example, the receiver can increase the gain setting and/or adjust the phase setting of an array of antennas in a particular direction to amplify (e.g., to increase the gain level of) the RF signals received from that direction. Thus, when a receiver is said to beamform in a certain direction, it means the beam gain in that direction is high relative to the beam gain along other directions, or the beam gain in that direction is the highest compared to the beam gain in that direction of all other receive beams available to the receiver. This results in a stronger received signal strength (e.g., reference signal received power (RSRP), reference signal received quality (RSRQ), signal-to-interference-plus-noise ratio (SINR), etc.) of the RF signals received from that direction.

Transmit and receive beams may be spatially related. A spatial relation means that parameters for a second beam (e.g., a transmit or receive beam) for a second reference signal can be derived from information about a first beam (e.g., a receive beam or a transmit beam) for a first reference signal. For example, a UE may use a particular receive beam to receive a reference downlink reference signal (e.g., synchronization signal block (SSB)) from a base station. The UE can then form a transmit beam for sending an uplink reference signal (e.g., sounding reference signal (SRS)) to that base station based on the parameters of the receive beam.

Note that a "downlink" beam may be either a transmit beam or a receive beam, depending on the entity forming it. For example, if a base station is forming the downlink beam to transmit a reference signal to a UE, the downlink beam is a transmit beam. If the UE is forming the downlink beam, however, it is a receive beam to receive the downlink reference signal. Similarly, an "uplink" beam may be either a transmit beam or a receive beam, depending on the entity forming it. For example, if a base station is forming the uplink beam, it is an uplink receive beam, and if a UE is forming the uplink beam, it is an uplink transmit beam.

The electromagnetic spectrum is often subdivided, based on frequency/wavelength, into various classes, bands, channels, etc. In 5G NR two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, FR4, FR4-a or FR4-1, and/or FR5, or may be within the EHF band.

In a multi-carrier system, such as 5G, one of the carrier frequencies is referred to as the "primary carrier" or "anchor carrier" or "primary serving cell" or "PCell," and the remaining carrier frequencies are referred to as "secondary carriers" or "secondary serving cells" or "SCells." In carrier aggregation, the anchor carrier is the carrier operating on the primary frequency (e.g., FR1) utilized by a UE 104/182 and the cell in which the UE 104/182 either performs the initial radio resource control (RRC) connection establishment procedure or initiates the RRC connection re-establishment procedure. The primary carrier carries all common and UE-specific control channels, and may be a carrier in a licensed frequency (however, this is not always the case). A secondary carrier is a carrier operating on a second frequency (e.g., FR2) that may be configured once the RRC connection is established between the UE 104 and the anchor carrier and that may be used to provide additional radio resources. In some cases, the secondary carrier may be a carrier in an unlicensed frequency. The secondary carrier may contain only necessary signaling information and signals, for example, those that are UE-specific may not be present in the secondary carrier, since both primary uplink and downlink carriers are typically UE-specific. This means that different UEs 104/182 in a cell may have different downlink primary carriers. The same is true for the uplink primary carriers. The network is able to change the primary carrier of any UE 104/182 at any time. This is done, for example, to balance the load on different carriers. Because a "serving cell" (whether a PCell or an SCell) corresponds to a carrier frequency/component carrier over which some base station is communicating, the term "cell," "serving cell," "component carrier," "carrier frequency," and the like can be used interchangeably.

For example, still referring to FIG. 1, one of the frequencies utilized by the macro cell base stations 102 may be an anchor carrier (or "PCell") and other frequencies utilized by the macro cell base stations 102 and/or the mmW base station 180 may be secondary carriers ("SCells"). The simultaneous transmission and/or reception of multiple carriers enables the UE 104/182 to significantly increase its data transmission and/or reception rates. For example, two 20 MHz aggregated carriers in a multi-carrier system would theoretically lead to a two-fold increase in data rate (i.e., 40 MHz), compared to that attained by a single 20 MHz carrier.

The wireless communications system 100 may further include a UE 164 that may communicate with a macro cell base station 102 over a communication link 120 and/or the mmW base station 180 over a mmW communication link 184. For example, the macro cell base station 102 may support a PCell and one or more SCells for the UE 164 and the mmW base station 180 may support one or more SCells for the UE 164.

In some cases, the UE 164 and the UE 182 may be capable of sidelink communication. Sidelink-capable UEs (SL-UEs) may communicate with base stations 102 over communication links 120 using the Uu interface (i.e., the air interface between a UE and a base station). SL-UEs (e.g., UE 164, UE 182) may also communicate directly with each other over a wireless sidelink 160 using the PC5 interface (i.e., the air interface between sidelink-capable UEs). A wireless sidelink (or just "sidelink") is an adaptation of the core cellular (e.g., LTE, NR) standard that allows direct communication between two or more UEs without the communication needing to go through a base station. Sidelink communication may be unicast or multicast, and may be used for device-to-device (D2D) media-sharing, vehicle-to-vehicle (V2V) communication, vehicle-to-everything (V2X) communication (e.g., cellular V2X (cV2X) communication, enhanced V2X (eV2X) communication, etc.), emergency rescue applications, etc. One or more of a group of SL-UEs utilizing sidelink communications may be within the geographic coverage area 110 of a base station 102. Other SL-UEs in such a group may be outside the geographic coverage area 110 of a base station 102 or be otherwise unable to receive transmissions from a base station 102. In some cases, groups of SL-UEs communicating via sidelink communications may utilize a one-to-many (1:M) system in which each SL-UE transmits to every other SL-UE in the group. In some cases, a base station 102 facilitates the scheduling of resources for sidelink communications. In other cases, sidelink communications are carried out between SL-UEs without the involvement of a base station 102.

In an aspect, the sidelink 160 may operate over a wireless communication medium of interest, which may be shared with other wireless communications between other vehicles and/or infrastructure access points, as well as other RATs. A "medium" may be composed of one or more time, frequency, and/or space communication resources (e.g., encompassing one or more channels across one or more carriers) associated with wireless communication between one or more transmitter/receiver pairs. In an aspect, the medium of interest may correspond to at least a portion of an unlicensed frequency band shared among various RATs. Although different licensed frequency bands have been reserved for certain communication systems (e.g., by a government entity such as the Federal Communications Commission (FCC) in the United States), these systems, in particular those employing small cell access points, have recently extended operation into unlicensed frequency bands such as the Unlicensed National Information Infrastructure (U-NII) band used by wireless local area network (WLAN) technologies, most notably IEEE 802.11x WLAN technologies generally referred to as "Wi-Fi." Example systems of this type include different variants of CDMA systems, TDMA systems, FDMA systems, orthogonal FDMA (OFDMA) systems, single-carrier FDMA (SC-FDMA) systems, and so on.

Note that although FIG. 1 only illustrates two of the UEs as SL-UEs (i.e., UEs 164 and 182), any of the illustrated UEs may be SL-UEs. Further, although only UE 182 was described as being capable of beamforming, any of the illustrated UEs, including UE 164, may be capable of beamforming. Where SL-UEs are capable of beamforming, they may beamform towards each other (i.e., towards other SL-UEs), towards other UEs (e.g., UEs 104), towards base stations (e.g., base stations 102, 180, small cell 102', access point 150), etc. Thus, in some cases, UEs 164 and 182 may utilize beamforming over sidelink 160.

In the example of FIG. 1, any of the illustrated UEs (shown in FIG. 1 as a single UE 104 for simplicity) may receive signals 124 from one or more Earth orbiting space vehicles (SVs) 112 (e.g., satellites). In an aspect, the SVs 112 may be part of a satellite positioning system that a UE 104 can use as an independent source of location information. A satellite positioning system typically includes a system of transmitters (e.g., SVs 112) positioned to enable receivers (e.g., UEs 104) to determine their location on or above the Earth based, at least in part, on positioning signals (e.g., signals 124) received from the transmitters. Such a transmitter typically transmits a signal marked with a repeating pseudo-random noise (PN) code of a set number of chips. While typically located in SVs 112, transmitters may sometimes be located on ground-based control stations, base stations 102, and/or other UEs 104. A UE 104 may include one or more dedicated receivers specifically designed to receive signals 124 for deriving geo location information from the SVs 112.

In a satellite positioning system, the use of signals 124 can be augmented by various satellite-based augmentation systems (SBAS) that may be associated with or otherwise enabled for use with one or more global and/or regional navigation satellite systems. For example an SBAS may include an augmentation system(s) that provides integrity information, differential corrections, etc., such as the Wide Area Augmentation System (WAAS), the European Geostationary Navigation Overlay Service (EGNOS), the Multi-functional Satellite Augmentation System (MSAS), the Global Positioning System (GPS) Aided Geo Augmented Navigation or GPS and Geo Augmented Navigation system (GAGAN), and/or the like. Thus, as used herein, a satellite positioning system may include any combination of one or more global and/or regional navigation satellites associated with such one or more satellite positioning systems.

In an aspect, SVs 112 may additionally or alternatively be part of one or more non-terrestrial networks (NTNs). In an NTN, an SV 112 is connected to an earth station (also referred to as a ground station, NTN gateway, or gateway), which in turn is connected to an element in a 5G network, such as a modified base station 102 (without a terrestrial antenna) or a network node in a 5GC. This element would in turn provide access to other elements in the 5G network and ultimately to entities external to the 5G network, such as Internet web servers and other user devices. In that way, a UE 104 may receive communication signals (e.g., signals 124) from an SV 112 instead of, or in addition to, communication signals from a terrestrial base station 102.

The wireless communications system 100 may further include one or more UEs, such as UE 190, that connects indirectly to one or more communication networks via one or more device-to-device (D2D) peer-to-peer (P2P) links (referred to as "sidelinks"). In the example of FIG. 1, UE 190 has a D2D P2P link 192 with one of the UEs 104 connected to one of the base stations 102 (e.g., through which UE 190 may indirectly obtain cellular connectivity) and a D2D P2P link 194 with WLAN STA 152 connected to the WLAN AP 150 (through which UE 190 may indirectly obtain WLAN-based Internet connectivity). In an example, the D2D P2P links 192 and 194 may be supported with any well-known D2D RAT, such as LTE Direct (LTE-D), WiFi Direct (WiFi-D), Bluetooth®, and so on.

Figure 2A:
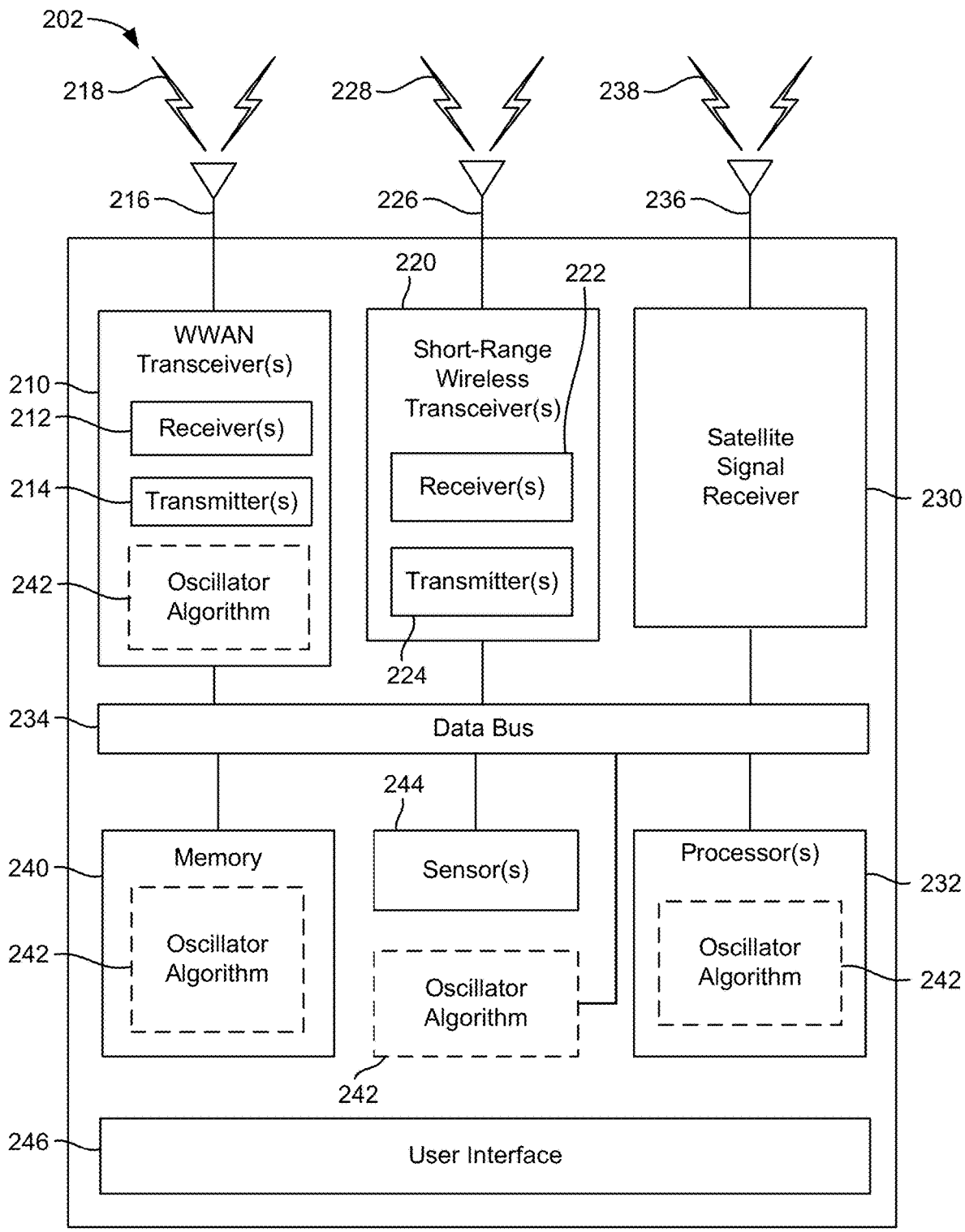
FIGS. 2A, 2B, and 2C are simplified block diagrams of several sample aspects of components that may be employed in a user equipment (UE), a base station, and a network entity, respectively, and configured to support communications as taught herein.
Figure 2B:
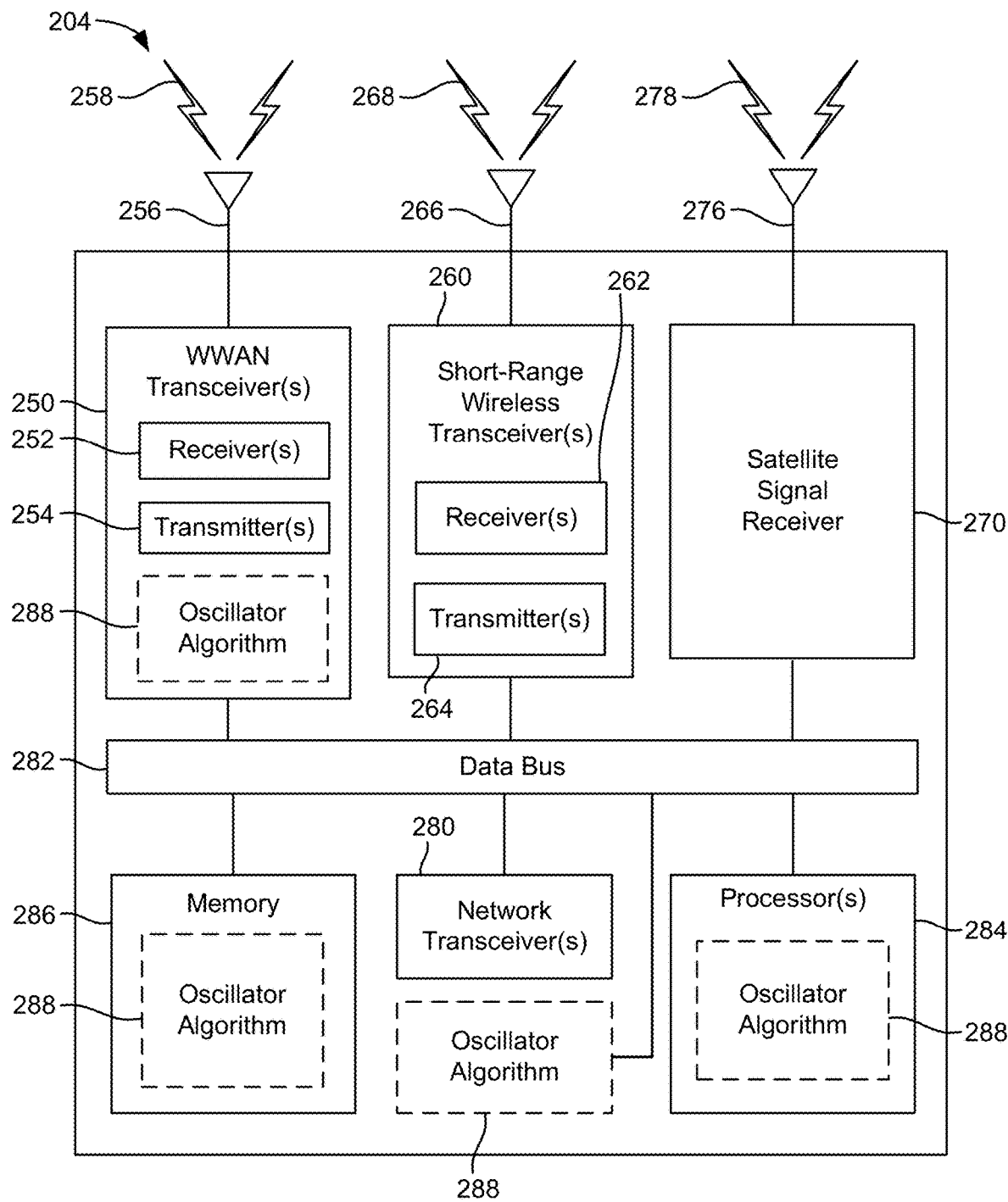
Figure 2C:
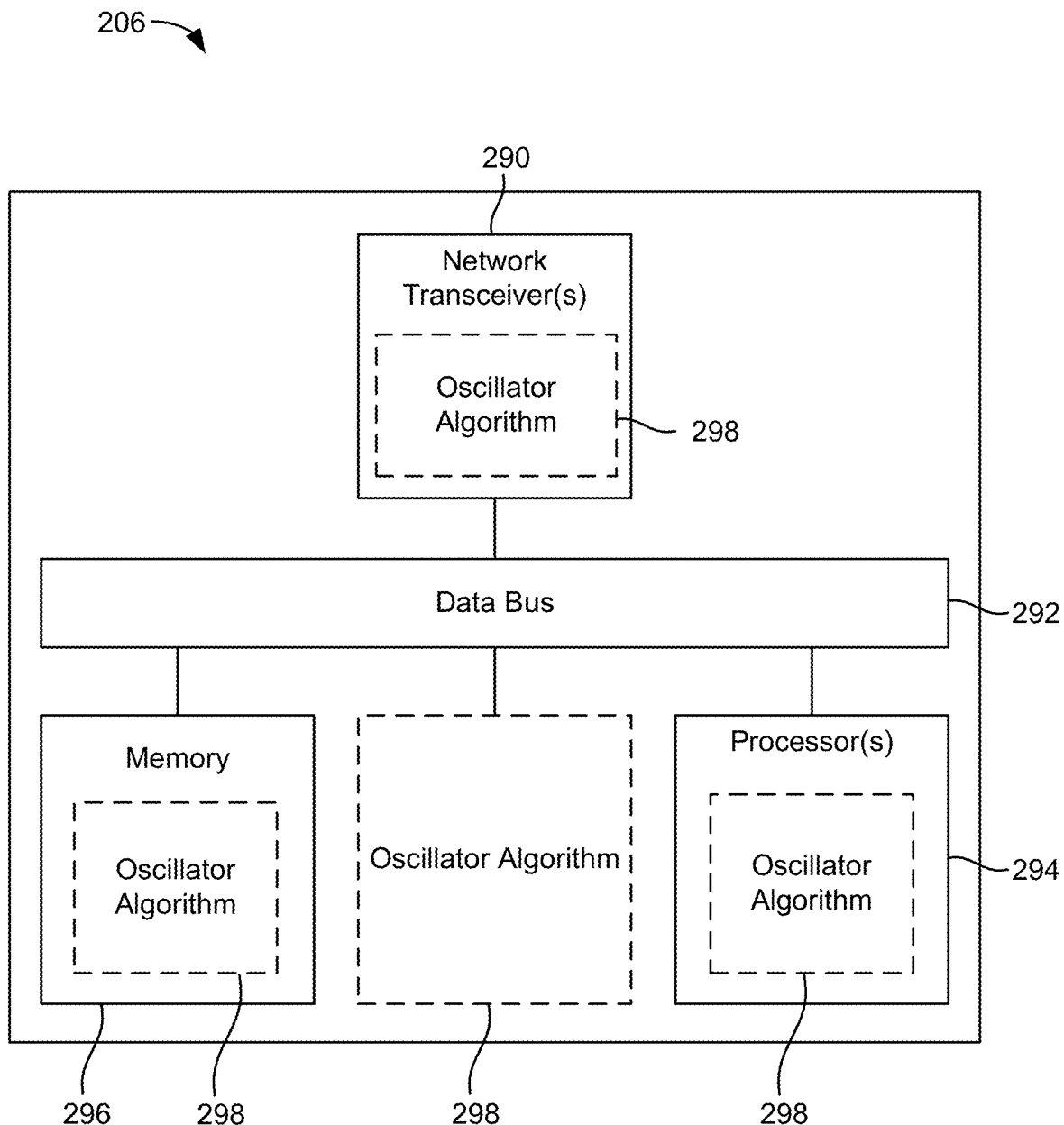

FIGS. 2A, 2B, and 2C illustrate several example components (represented by corresponding blocks) that may be incorporated into a UE 202 (which may correspond to any of the UEs described herein), a base station 204 (which may correspond to any of the base stations described herein), and a network entity 206 (which may correspond to or embody any of the network functions described herein) to support the operations described herein. It will be appreciated that these components may be implemented in different types of apparatuses in different implementations (e.g., in an ASIC, in a system-on-chip (SoC), etc.). The illustrated components may also be incorporated into other apparatuses in a communication system. For example, other apparatuses in a system may include components similar to those described to provide similar functionality. Also, a given apparatus may contain one or more of the components. For example, an apparatus may include multiple transceiver components that enable the apparatus to operate on multiple carriers and/or communicate via different technologies.

The UE 202 and the base station 204 each include one or more wireless wide area network (WWAN) transceivers 210 and 250, respectively, providing means for communicating (e.g., means for transmitting, means for receiving, means for measuring, means for tuning, means for refraining from transmitting, etc.) via one or more wireless communication networks (not shown), such as an NR network, an LTE network, a GSM network, and/or the like. The WWAN transceivers 210 and 250 may each be connected to one or more antennas 216 and 256, respectively, for communicating with other network nodes, such as other UEs, access points, base stations (e.g., eNBs, gNBs), etc., via at least one designated RAT (e.g., NR, LTE, GSM, etc.) over a wireless communication medium of interest (e.g., some set of time/frequency resources in a particular frequency spectrum). The WWAN transceivers 210 and 250 may be variously configured for transmitting and encoding signals 218 and 258 (e.g., messages, indications, information, and so on), respectively, and, conversely, for receiving and decoding signals 218 and 258 (e.g., messages, indications, information, pilots, and so on), respectively, in accordance with the designated RAT. Specifically, the WWAN transceivers 210 and 250 include one or more transmitters 214 and 254, respectively, for transmitting and encoding signals 218 and 258, respectively, and one or more receivers 212 and 252, respectively, for receiving and decoding signals 218 and 258, respectively.

The UE 202 and the base station 204 each also include, at least in some cases, one or more short-range wireless transceivers 220 and 260, respectively. The short-range wireless transceivers 220 and 260 may be connected to one or more antennas 226 and 266, respectively, and provide means for communicating (e.g., means for transmitting, means for receiving, means for measuring, means for tuning, means for refraining from transmitting, etc.) with other network nodes, such as other UEs, access points, base stations, etc., via at least one designated RAT (e.g., WiFi, LTE-D, Bluetooth®, Zigbee®, Z-Wave®, PC5, dedicated short-range communications (DSRC), wireless access for vehicular environments (WAVE), near-field communication (NFC), ultra-wideband (UWB), etc.) over a wireless communication medium of interest. The short-range wireless transceivers 220 and 260 may be variously configured for transmitting and encoding signals 228 and 268 (e.g., messages, indications, information, and so on), respectively, and, conversely, for receiving and decoding signals 228 and 268 (e.g., messages, indications, information, pilots, and so on), respectively, in accordance with the designated RAT. Specifically, the short-range wireless transceivers 220 and 260 include one or more transmitters 224 and 264, respectively, for transmitting and encoding signals 228 and 268, respectively, and one or more receivers 222 and 262, respectively, for receiving and decoding signals 228 and 268, respectively. As specific examples, the short-range wireless transceivers 220 and 260 may be WiFi transceivers, Bluetooth® transceivers, Zigbee® and/or Z-Wave® transceivers, NFC transceivers, UWB transceivers, or vehicle-to-vehicle (V2V) and/or vehicle-to-everything (V2X) transceivers.

The UE 202 and the base station 204 also include, at least in some cases, satellite signal receivers 230 and 270. The satellite signal receivers 230 and 270 may be connected to one or more antennas 236 and 276, respectively, and may provide means for receiving and/or measuring satellite positioning/communication signals 238 and 278, respectively.

Where the satellite signal receivers 230 and 270 are satellite positioning system receivers, the satellite positioning/communication signals 238 and 278 may be global positioning system (GPS) signals, global navigation satellite system (GLONASS) signals, Galileo signals, Beidou signals, Indian Regional Navigation Satellite System (NAVIC), Quasi-Zenith Satellite System (QZSS), etc. Where the satellite signal receivers 230 and 270 are non-terrestrial network (NTN) receivers, the satellite positioning/communication signals 238 and 278 may be communication signals (e.g., carrying control and/or user data) originating from a 5G network. The satellite signal receivers 230 and 270 may comprise any suitable hardware and/or software for receiving and processing satellite positioning/communication signals 238 and 278, respectively. The satellite signal receivers 230 and 270 may request information and operations as appropriate from the other systems, and, at least in some cases, perform calculations to determine locations of the UE 202 and the base station 204, respectively, using measurements obtained by any suitable satellite positioning system algorithm.

The base station 204 and the network entity 206 each include one or more network transceivers 280 and 290, respectively, providing means for communicating (e.g., means for transmitting, means for receiving, etc.) with other network entities (e.g., other base stations 204, other network entities 206). For example, the base station 204 may employ the one or more network transceivers 280 to communicate with other base stations 204 or network entities 206 over one or more wired or wireless backhaul links. As another example, the network entity 206 may employ the one or more network transceivers 290 to communicate with one or more base station 204 over one or more wired or wireless backhaul links, or with other network entities 206 over one or more wired or wireless core network interfaces.

A transceiver may be configured to communicate over a wired or wireless link. A transceiver (whether a wired transceiver or a wireless transceiver) includes transmitter circuitry (e.g., transmitters 214, 224, 254, 264) and receiver circuitry (e.g., receivers 212, 222, 252, 262). A transceiver may be an integrated device (e.g., embodying transmitter circuitry and receiver circuitry in a single device) in some implementations, may comprise separate transmitter circuitry and separate receiver circuitry in some implementations, or may be embodied in other ways in other implementations. The transmitter circuitry and receiver circuitry of a wired transceiver (e.g., network transceivers 280 and 290 in some implementations) may be coupled to one or more wired network interface ports. Wireless transmitter circuitry (e.g., transmitters 214, 224, 254, 264) may include or be coupled to a plurality of antennas (e.g., antennas 216, 226, 256, 266), such as an antenna array, that permits the respective apparatus (e.g., UE 202, base station 204) to perform transmit "beamforming," as described herein. Similarly, wireless receiver circuitry (e.g., receivers 212, 222, 252, 262) may include or be coupled to a plurality of antennas (e.g., antennas 216, 226, 256, 266), such as an antenna array, that permits the respective apparatus (e.g., UE 202, base station 204) to perform receive beamforming, as described herein. In an aspect, the transmitter circuitry and receiver circuitry may share the same plurality of antennas (e.g., antennas 216, 226, 256, 266), such that the respective apparatus can only receive or transmit at a given time, not both at the same time. A wireless transceiver (e.g., WWAN transceivers 210 and 250, short-range wireless transceivers 220 and 260) may also include a network listen module (NLM) or the like for performing various measurements.

As used herein, the various wireless transceivers (e.g., transceivers 210, 220, 250, and 260, and network transceivers 280 and 290 in some implementations) and wired transceivers (e.g., network transceivers 280 and 290 in some implementations) may generally be characterized as "a transceiver," "at least one transceiver," or "one or more transceivers." As such, whether a particular transceiver is a wired or wireless transceiver may be inferred from the type of communication performed. For example, backhaul communication between network devices or servers will generally relate to signaling via a wired transceiver, whereas wireless communication between a UE (e.g., UE 202) and a base station (e.g., base station 204) will generally relate to signaling via a wireless transceiver.

The UE 202, the base station 204, and the network entity 206 also include other components that may be used in conjunction with the operations as disclosed herein. The UE 202, the base station 204, and the network entity 206 include one or more processors 232, 284, and 294, respectively, for providing functionality relating to, for example, wireless communication, and for providing other processing functionality. The processors 232, 284, and 294 may therefore provide means for processing, such as means for determining, means for calculating, means for receiving, means for transmitting, means for indicating, etc. In an aspect, the processors 232, 284, and 294 may include, for example, one or more general purpose processors, multi-core processors, central processing units (CPUs), ASICs, digital signal processors (DSPs), field programmable gate arrays (FPGAs), other programmable logic devices or processing circuitry, or various combinations thereof.

The UE 202, the base station 204, and the network entity 206 include memory circuitry implementing memories 240, 286, and 296 (e.g., each including a memory device), respectively, for maintaining information (e.g., information indicative of reserved resources, thresholds, parameters, and so on). The memories 240, 286, and 296 may therefore provide means for storing, means for retrieving, means for maintaining, etc. In some cases, the UE 202, the base station 204, and the network entity 206 may include oscillator algorithm 242, 288, and 298, respectively. The oscillator algorithm 242, 288, and 298 may be hardware circuits that are part of or coupled to the processors 232, 284, and 294, respectively, that, when executed, cause the UE 202, the base station 204, and the network entity 206 to perform the functionality described herein. In other aspects, the oscillator algorithm 242, 288, and 298 may be external to the processors 232, 284, and 294 (e.g., part of a modem processing system, integrated with another processing system, etc.). Alternatively, the oscillator algorithm 242, 288, and 298 may be memory modules stored in the memories 240, 286, and 296, respectively, that, when executed by the processors 232, 284, and 294 (or a modem processing system, another processing system, etc.), cause the UE 202, the base station 204, and the network entity 206 to perform the functionality described herein. FIG. 2A illustrates possible locations of the oscillator algorithm 242, which may be, for example, part of the one or more WWAN transceivers 210, the memory 240, the one or more processors 232, or any combination thereof, or may be a standalone component. FIG. 2B illustrates possible locations of the oscillator algorithm 288, which may be, for example, part of the one or more WWAN transceivers 250, the memory 286, the one or more processors 284, or any combination thereof, or may be a standalone component. FIG. 2C illustrates possible locations of the oscillator algorithm 298, which may be, for example, part of the one or more network transceivers 290, the memory 296, the one or more processors 294, or any combination thereof, or may be a standalone component.

The UE 202 may include one or more sensors 244 coupled to the one or more processors 232 to provide means for sensing or detecting movement and/or orientation information that is independent of motion data derived from signals received by the one or more WWAN transceivers 210, the one or more short-range wireless transceivers 220, and/or the satellite signal receiver 230. By way of example, the sensor(s) 244 may include an accelerometer (e.g., a microelectromechanical system (MEMS) device), a gyroscope, a geomagnetic sensor (e.g., a compass), an altimeter (e.g., a barometric pressure altimeter), and/or any other type of movement detection sensor. Moreover, the sensor(s) 244 may include a plurality of different types of devices and combine their outputs in order to provide motion information. For example, the sensor(s) 244 may use a combination of a multi-axis accelerometer and orientation sensors to provide the ability to compute positions in two-dimensional (2D) and/or three-dimensional (3D) coordinate systems.

In addition, the UE 202 includes a user interface 246 providing means for providing indications (e.g., audible and/or visual indications) to a user and/or for receiving user input (e.g., upon user actuation of a sensing device such a keypad, a touch screen, a microphone, and so on). Although not shown, the base station 204 and the network entity 206 may also include user interfaces.

Referring to the one or more processors 284 in more detail, in the downlink, IP packets from the network entity 206 may be provided to the processor 284. The one or more processors 284 may implement functionality for an RRC layer, a packet data convergence protocol (PDCP) layer, a radio link control (RLC) layer, and a medium access control (MAC) layer. The one or more processors 284 may provide RRC layer functionality associated with broadcasting of system information (e.g., master information block (MIB), system information blocks (SIBs)), RRC connection control (e.g., RRC connection paging, RRC connection establishment, RRC connection modification, and RRC connection release), inter-RAT mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer PDUs, error correction through automatic repeat request (ARQ), concatenation, segmentation, and reassembly of RLC service data units (SDUs), re-segmentation of RLC data PDUs, and reordering of RLC data PDUs; and MAC layer functionality associated with mapping between logical channels and transport channels, scheduling information reporting, error correction, priority handling, and logical channel prioritization.

The transmitter 254 and the receiver 252 may implement Layer-1 (L1) functionality associated with various signal processing functions. Layer-1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The transmitter 254 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an orthogonal frequency division multiplexing (OFDM) subcarrier, multiplexed with a reference signal (e.g., pilot) in the time and/or frequency domain, and then combined together using an inverse fast Fourier transform (IFFT) to produce a physical channel carrying a time domain OFDM symbol stream. The OFDM symbol stream is spatially precoded to produce multiple spatial streams. Channel estimates from a channel estimator may be used to determine the coding and modulation scheme, as well as for spatial processing. The channel estimate may be derived from a reference signal and/or channel condition feedback transmitted by the UE 202. Each spatial stream may then be provided to one or more different antennas 256. The transmitter 254 may modulate an RF carrier with a respective spatial stream for transmission.

At the UE 202, the receiver 212 receives a signal through its respective antenna(s) 216. The receiver 212 recovers information modulated onto an RF carrier and provides the information to the one or more processors 232. The transmitter 214 and the receiver 212 implement Layer-1 functionality associated with various signal processing functions. The receiver 212 may perform spatial processing on the information to recover any spatial streams destined for the UE 202. If multiple spatial streams are destined for the UE 202, they may be combined by the receiver 212 into a single OFDM symbol stream. The receiver 212 then converts the OFDM symbol stream from the time-domain to the frequency domain using a fast Fourier transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 204. These soft decisions may be based on channel estimates computed by a channel estimator. The soft decisions are then decoded and de-interleaved to recover the data and control signals that were originally transmitted by the base station 204 on the physical channel. The data and control signals are then provided to the one or more processors 232, which implements Layer-3 (L3) and Layer-2 (L2) functionality.

In the downlink, the one or more processors 232 provides demultiplexing between transport and logical channels, packet reassembly, deciphering, header decompression, and control signal processing to recover IP packets from the core network. The one or more processors 232 are also responsible for error detection.

Similar to the functionality described in connection with the downlink transmission by the base station 204, the one or more processors 232 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through hybrid automatic repeat request (HARQ), priority handling, and logical channel prioritization.

Channel estimates derived by the channel estimator from a reference signal or feedback transmitted by the base station 204 may be used by the transmitter 214 to select the appropriate coding and modulation schemes, and to facilitate spatial processing. The spatial streams generated by the transmitter 214 may be provided to different antenna(s) 216. The transmitter 214 may modulate an RF carrier with a respective spatial stream for transmission.

The uplink transmission is processed at the base station 204 in a manner similar to that described in connection with the receiver function at the UE 202. The receiver 252 receives a signal through its respective antenna(s) 256. The receiver 252 recovers information modulated onto an RF carrier and provides the information to the one or more processors 284.

In the uplink, the one or more processors 284 provides demultiplexing between transport and logical channels, packet reassembly, deciphering, header decompression, control signal processing to recover IP packets from the UE 202. IP packets from the one or more processors 284 may be provided to the core network. The one or more processors 284 are also responsible for error detection.

For convenience, the UE 202, the base station 204, and/or the network entity 206 are shown in FIGS. 2A, 2B, and 2C as including various components that may be configured according to the various examples described herein. It will be appreciated, however, that the illustrated components may have different functionality in different designs. In particular, various components in FIGS. 2A to 2C are optional in alternative configurations and the various aspects include configurations that may vary due to design choice, costs, use of the device, or other considerations. For example, in case of FIG. 2A, a particular implementation of UE 202 may omit the WWAN transceiver(s) 210 (e.g., a wearable device or tablet computer or PC or laptop may have Wi-Fi and/or Bluetooth capability without cellular capability), or may omit the short-range wireless transceiver(s) 220 (e.g., cellular-only, etc.), or may omit the satellite signal receiver 230, or may omit the sensor(s) 244, and so on. In another example, in case of FIG. 2B, a particular implementation of the base station 204 may omit the WWAN transceiver(s) 250 (e.g., a Wi-Fi "hotspot" access point without cellular capability), or may omit the short-range wireless transceiver(s) 260 (e.g., cellular-only, etc.), or may omit the satellite signal receiver 270, and so on. For brevity, illustration of the various alternative configurations is not provided herein, but would be readily understandable to one skilled in the art.

The various components of the UE 202, the base station 204, and the network entity 206 may be communicatively coupled to each other over data buses 234, 282, and 292, respectively. In an aspect, the data buses 234, 282, and 292 may form, or be part of, a communication interface of the UE 202, the base station 204, and the network entity 206, respectively. For example, where different logical entities are embodied in the same device (e.g., gNB and location server functionality incorporated into the same base station 204), the data buses 234, 282, and 292 may provide communication between them.

The components of FIGS. 2A, 2B, and 2C may be implemented in various ways. In some implementations, the components of FIGS. 2A, 2B, and 2C may be implemented in one or more circuits such as, for example, one or more processors and/or one or more ASICs (which may include one or more processors). Here, each circuit may use and/or incorporate at least one memory component for storing information or executable code used by the circuit to provide this functionality. For example, some or all of the functionality represented by blocks 210 to 246 may be implemented by processor and memory component(s) of the UE 202 (e.g., by execution of appropriate code and/or by appropriate configuration of processor components). Similarly, some or all of the functionality represented by blocks 250 to 288 may be implemented by processor and memory component(s) of the base station 204 (e.g., by execution of appropriate code and/or by appropriate configuration of processor components). Also, some or all of the functionality represented by blocks 290 to 298 may be implemented by processor and memory component(s) of the network entity 206 (e.g., by execution of appropriate code and/or by appropriate configuration of processor components). For simplicity, various operations, acts, and/or functions are described herein as being performed "by a UE," "by a base station," "by a network entity," etc. However, as will be appreciated, such operations, acts, and/or functions may actually be performed by specific components or combinations of components of the UE 202, base station 204, network entity 206, etc., such as the processors 232, 284, 294, the transceivers 210, 220, 250, and 260, the memories 240, 286, and 296, the oscillator algorithm 242, 288, and 298, etc.

In some designs, the network entity 206 may be implemented as a core network component. In other designs, the network entity 206 may be distinct from a network operator or operation of the cellular network infrastructure (e.g., core network 170). For example, the network entity 206 may be a component of a private network that may be configured to communicate with the UE 202 via the base station 204 or independently from the base station 204 (e.g., over a non-cellular communication link, such as WiFi).

Many electronic devices utilize oscillators, such as MEMS oscillators or crystal oscillators, to produce a stable clock reference signal for optimum performance. An oscillator is an electronic circuit that produces a periodic, oscillating electronic signal, often a sine wave, a square wave, or a triangle wave. A MEMS oscillator incorporates one or more MEMS resonators to generate highly stable reference frequencies to measure time. MEMS resonators are small electromechanical structures that vibrate at high frequencies. For frequency and timing references, MEMS resonators are attached to electronic circuits, referred to as sustaining amplifiers, to drive them in continuous motion. A crystal oscillator is an electronic oscillator circuit that uses a piezoelectric crystal (e.g., a quartz crystal) as a frequency-selective element. The oscillator frequency is often used to keep track of time, to provide a stable clock signal for digital integrated circuits, and to stabilize frequencies for radio transmitters and receivers.

Oscillators suffer from temperature-based frequency fluctuations, referred to as the oscillator's frequency-temperature characteristics. As such, there is a need to compensate the oscillators to minimize the effect that temperature variations have on the oscillator's frequency. To that end, there are four general types of crystal oscillators. A simple packaged crystal oscillator (SPXO), or simply a crystal oscillator or clock, does not have temperature control or temperature compensation. Instead, the frequency-temperature characteristics depend on the crystal units. A temperature compensated crystal oscillator (TCXO) has a temperature compensation circuit to suppress output frequency deviation caused by surrounding temperature. That is, the output signal from a temperature sensor (e.g., a thermistor) is used to generate a correction voltage that is applied to a variable reactance (e.g., a varactor) in the crystal network. An oven-controlled crystal oscillator (OCXO) usually contains an oven block where a temperature sensor, heating element, oven circuitry, and insulation function to maintain a stable temperature. A voltage-controlled crystal oscillator has a tunable output frequency or modulated output frequency by external control voltage.

A thermistor is a type of resistor whose resistance is strongly dependent on temperature, more so than in standard resistors. Thermistors are divided based on their conduction model. Negative temperature coefficient (NTC) thermistors have less resistance at higher temperatures, while positive temperature coefficient (PTC) thermistors have more resistance at higher temperatures. NTC thermistor are widely used as inrush current limiters and temperature sensors, while PTC thermistors are used as self-resetting overcurrent protectors and self-regulating heating elements. With respect to compensating for the frequency-temperature characteristics of an oscillator, a thermistor network is tailored to the oscillator to cause the voltage to vary with temperature in such a manner that it will compensate for the oscillator's temperature-based frequency fluctuations.

Thermistor-based oscillator temperature measurements are naturally noisy. The thermistor noise level varies depending on the oscillator vendor, the hardware layout, and the power management integrated circuit (PMIC) package. A higher oscillator temperature noise level leads to a larger error in the oscillator frequency estimation based on the frequency-temperature curve of the oscillator. This is a particular issue for applications that require a highly accurate oscillator frequency source, such as a satellite navigation system (e.g., GPS, a global navigation satellite system (GNSS), etc.).

A frequency estimation algorithm is used to estimate the frequency of the oscillator to determine the frequency error of the oscillator caused by the temperature noise of the thermistor. Using a single solution to address all levels of thermistor temperature noise leads to a conservative oscillator frequency estimation algorithm that works for all noise levels, even the worst-case scenario (i.e., a one size fits all approach). A conservative algorithm would cause a slow filter response, especially in fast thermal transient conditions, which would lead to a large time delay in oscillator frequency estimation and therefore degradation in system performance (e.g., GNSS location accuracy).

Accordingly, the present disclosure provides techniques to adaptively update the oscillator frequency estimation algorithm parameters based on the on-device measured oscillator temperature noise level. "On-device" means the oscillator temperature noise level is continuously measured, as opposed to offline measurements based on collected data. As such, the oscillator temperature noise measurement is updated with each new temperature reading. The techniques of the present disclosure are particularly applicable to non-temperature-compensated oscillators, such as crystal oscillators, but are applicable to any type of oscillator that suffers from temperature-based frequency fluctuation.

Figure 3:
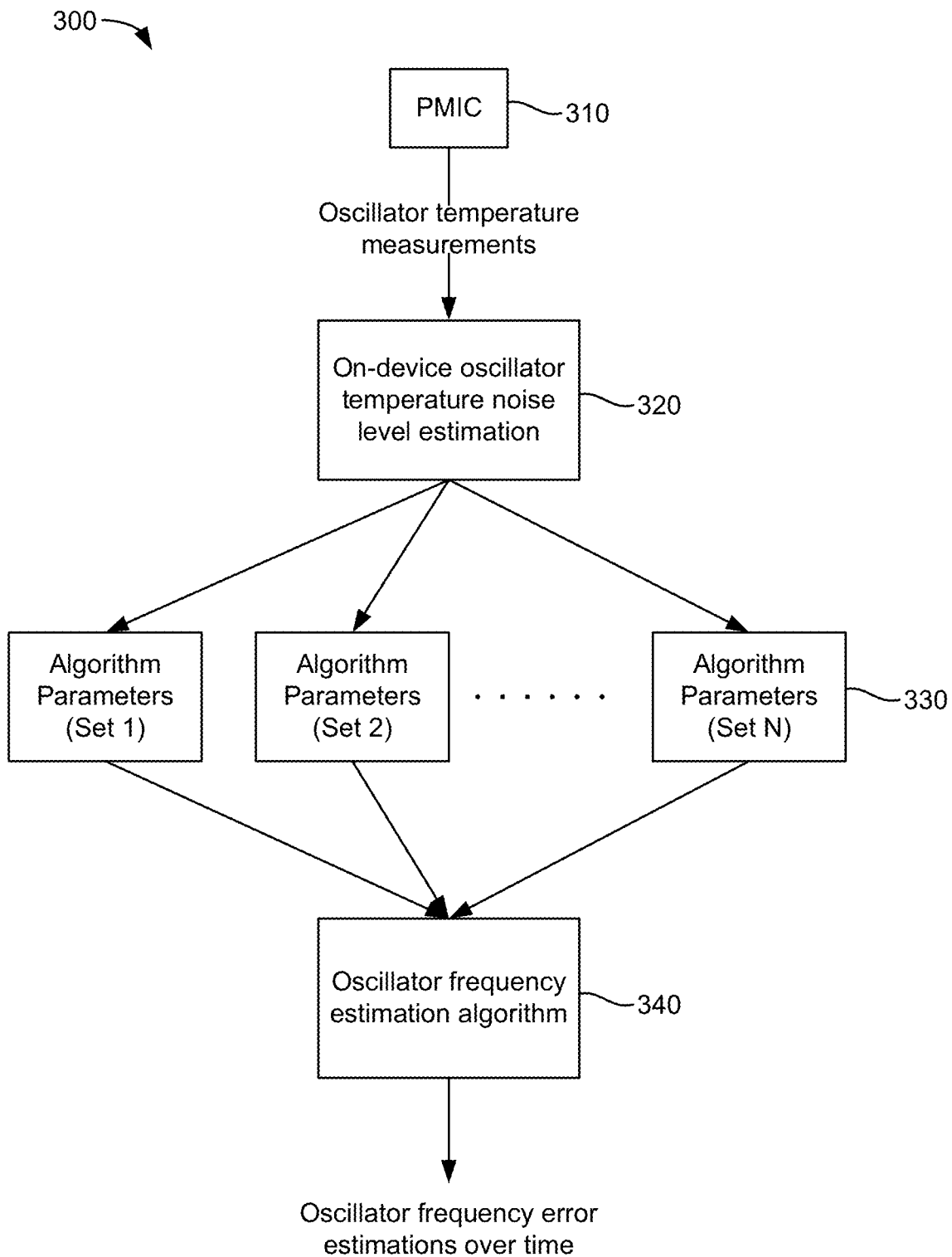
FIG. 3 is a block diagram illustrating the inputs to and output of an oscillator frequency estimation algorithm, according to aspects of the disclosure.

FIG. 3 is a block diagram 300 illustrating the inputs to and output of an oscillator frequency estimation algorithm, according to aspects of the disclosure. As shown in FIG. 3, a PMIC 310 may output temperature measurements of an oscillator, such as a crystal oscillator. A PMIC, such as PMIC 310, may be used to manage power in an electronic device or in modules on the device that may have a range of voltages. A PMIC may manage battery power charging and sleep modes, DC-to-DC conversion, scaling of voltages down or up, and the like. The PMIC 310 may include or be coupled to the oscillator being measured.

Based on the measurements from the PMIC 310, an on-device oscillator temperature noise level estimation block 320 may estimate the temperature noise level of the oscillator and output different sets of algorithm parameters 330 for the oscillator frequency estimation algorithm. In the example of FIG. 3, N sets of parameters may be determined, where N is greater than or equal to 1. Based on the determined sets of parameters, the oscillator frequency estimation algorithm block 340 may estimate oscillator frequency errors over time.

Note that blocks 320 to 340 may be implemented in the software (e.g., may be software blocks or software modules) of a particular system of an electronic device, such as the GNSS system of the electronic device. Based on the estimated oscillator frequency errors, the software may provide frequency correction feedback to the corresponding hardware, such as the GNSS hardware.

Referring to the on-device oscillator temperature noise level estimation block 320 in greater detail, it is challenging to calculate the absolute value of the noise variance of the oscillator given the true thermal dynamics of the electronic device housing the oscillator. As such, the present techniques use the differential values remaining after removing an estimated value of any true thermal changes.

Specifically, the differential variance (denoted "DVar") is a function of the differential temperature (denoted "DT"). Differential temperature (DT) values are calculated after removing an estimate of any genuine temperature movement, as the noise estimation calculation should be insensitive to any true oscillator temperature changes. That is, the on-device oscillator temperature noise level estimation block 320 should focus only on temperature noise and not actual changes in temperature. The on-device oscillator temperature noise level estimation block 320 may use the following equations to determine the differential temperature (DT) values and the differential variance (DVar):

$$DT(n)=f(\text{differential } T(n))$$

$$DVar(n)=f(DVar(n-1),DT(n))$$

The following are specific examples of the functions f(differential T(n)) and f(DVar(n−1), DT(n)), where the variable m is an odd number:

$$DT(n)=(1/m)*(T(n)-T(n-m))-(T(n-\text{floor}(m/2))-T(n-\text{ceil}(m/2)))$$

$$DVar(n)=(1-w)*DVar(n-1)+w*(DT(n)*DT(n))$$

If m is even, then the following are specific examples of the functions f(differential T(n)) and f(DVar(n−1), DT(n)):

$$DT(n)=(1/m)*(T(n)-T(n-m))-(T(n-\text{floor}(m/2))-T(n-\text{ceil}(m/3)))$$

$$DVar(n)=(1-w)*DVar(n-1)+w*(DT(n)*DT(n))$$

In the above equations, m is some number of temperature readings (e.g., 10 readings) and n is the index of a specific temperature reading. T(n) is the temperature reading at index n and w is the filter weight. The purpose of the differential temperature equation DT(n) is to determine the average (1/m) of T(n)−T(n−m), resulting in a large window that includes the actual temperature changes and the temperature noise, then remove the center of the window using floor and ceiling functions to remove the actual temperature changes. This results in an estimate of the temperature noise level. Note that the differential temperature equation DT(n) does not require the floor and ceiling functions; rather, these functions can be replaced by any function(s) that remove the center of the larger window (i.e., (1/m)*(T(n)−T(n−m))).

Referring to the filter weight, there may be two configurations for this filter. One is a convergence mode, where the weight value w is set to a large value (e.g., in the range of 0.01). This mode is beneficial for fast algorithm convergence in the initial period of time after the electronic device boots up for the first time (e.g., in the range of multiple tens of seconds). Another configuration is a tracking mode that uses a small weight value w (e.g., in the range of 0.00005). This mode may be used to slowly track the noise level while being insensitive to true thermal transients. Generally, the on-device oscillator temperature noise level estimation block 320 would use the convergence mode for the filter weight (e.g., after device bootup) and then switch to the tracking mode.

Referring to the determination of the frequency estimation algorithm parameters (the sets of algorithm parameters 330 in FIG. 3), these may be, for example, parameters determined based on an infinite impulse response (IIR) low pass filter being applied to the frequency-temperature curve output of the oscillator (e.g., as indicated by the temperature measurements of the oscillator). An IIR filter is a type of digital filter that uses a feedback mechanism. Specifically, an IIR filter uses current and past output data. The following equation is an example of an IIR filter used by the on-device oscillator temperature noise level estimation block 320 to determine the algorithm parameters 330 for the oscillator frequency estimation algorithm block 340:

$$\text{Value\_new} = \text{Value\_old} + \text{filter\_coeff} * (\text{Raw\_value} - \text{Value\_old})$$

In the above equation, "Raw_value" is the current instantaneous estimated value. Various filter modes may depend on the filter_coeff configuration. For example, a fast filter may have a filter_coeff=1, a medium filter may have a filter_coeff=2, and a slow filter may have a filter_coeff=4.

The outputs of the IIR filter may be combined with the dynamic filter weights that are configured by the on-device oscillator temperature noise level estimation block 320. In an aspect, more weights may be allocated to the fast filter output when the noise level is low (e.g., below some threshold), whereas in the case of high noise levels (e.g., above some threshold), more weights may be allocated to the slow filter output.

As will be appreciated, adaptively updating the configuration of the oscillator frequency estimation algorithm block 340 leads to a customized algorithm configuration based on the electronic device's specific noise level (as opposed to a conservative algorithm that applies to all devices), which in turn improves the oscillator frequency error estimations.

Figure 4:
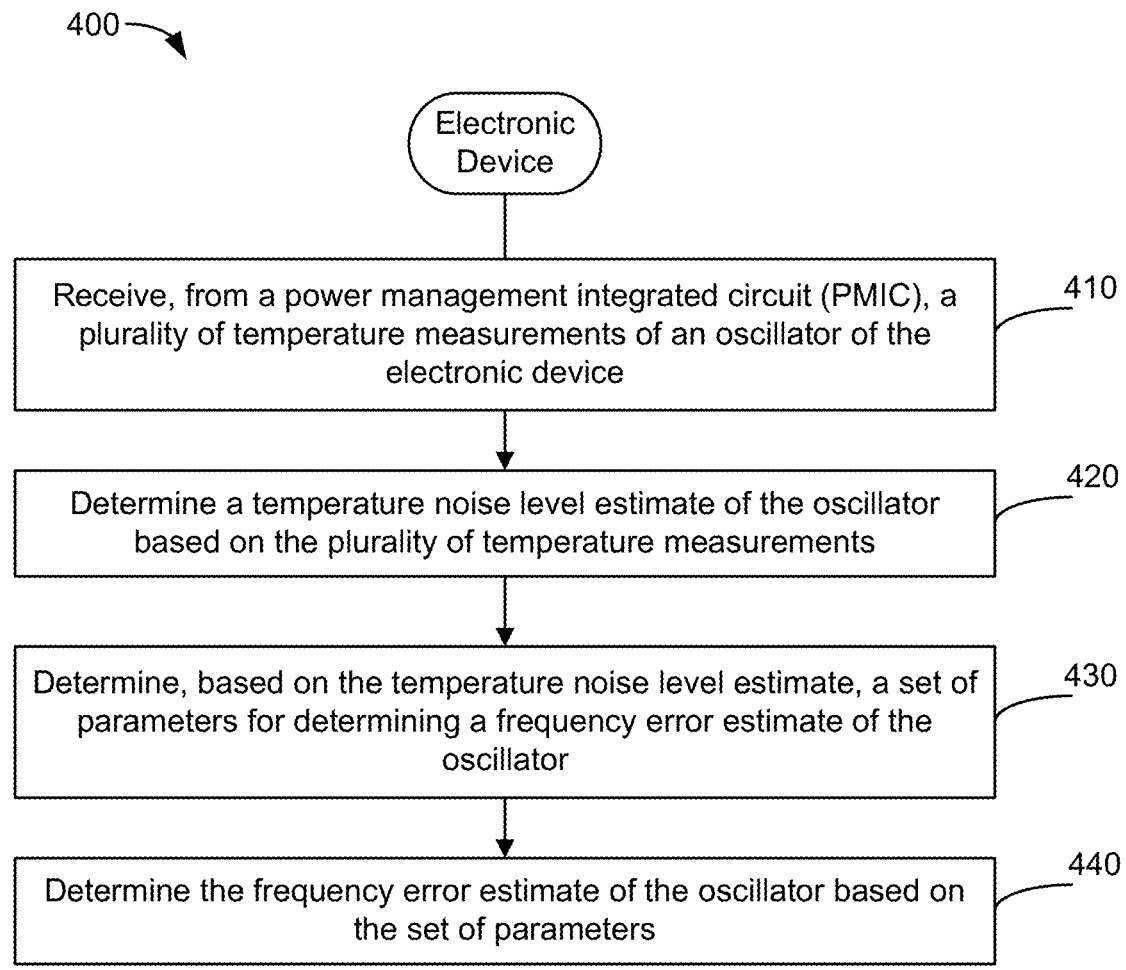
FIG. 4 illustrates an example method of oscillator frequency error estimation, according to aspects of the disclosure.

FIG. 4 illustrates an example method 400 of oscillator frequency error estimation, according to aspects of the disclosure. In an aspect, method 400 may be performed by an electronic device (e.g., any of the UEs, base stations, or other electronic devices described herein).

At 410, the electronic device receives, from a PMIC (e.g., PMIC 310), a plurality of temperature measurements of an oscillator of the electronic device. In an aspect, where the electronic device is a UE, operation 410 may be performed by the one or more WWAN transceivers 210, the one or more short-range wireless transceivers 220, the satellite signal receiver 230, the one or more processors 232, memory 240, and/or oscillator algorithm 242, any or all of which may be considered means for performing this operation. In an aspect, where the electronic device is a base station, operation 410 may be performed by the one or more WWAN transceivers 250, the one or more short-range wireless transceivers 260, the satellite signal receiver 270, the one or more processors 284, memory 286, and/or oscillator algorithm 288, any or all of which may be considered means for performing this operation. In an aspect, where the electronic device is a network entity, operation 410 may be performed by the one or more network transceivers 290, the one or more processors 294, memory 296, and/or oscillator algorithm 298, any or all of which may be considered means for performing this operation.

At 420, the electronic device (e.g., on-device oscillator temperature noise level estimation block 320) determines a temperature noise level estimate of the oscillator based on the plurality of temperature measurements. In an aspect, where the electronic device is a UE, operation 420 may be performed by the one or more WWAN transceivers 210, the one or more short-range wireless transceivers 220, the satellite signal receiver 230, the one or more processors 232, memory 240, and/or oscillator algorithm 242, any or all of which may be considered means for performing this operation. In an aspect, where the electronic device is a base station, operation 420 may be performed by the one or more WWAN transceivers 250, the one or more short-range wireless transceivers 260, the satellite signal receiver 270, the one or more processors 284, memory 286, and/or oscillator algorithm 288, any or all of which may be considered means for performing this operation. In an aspect, where the electronic device is a network entity, operation 420 may be performed by the one or more network transceivers 290, the one or more processors 294, memory 296, and/or oscillator algorithm 298, any or all of which may be considered means for performing this operation.

At 430, the electronic device (e.g., on-device oscillator temperature noise level estimation block 320) determines, based on the temperature noise level estimate, a set of parameters (e.g., algorithm parameters 330) for determining a frequency error estimate of the oscillator. In an aspect, where the electronic device is a UE, operation 430 may be performed by the one or more WWAN transceivers 210, the one or more short-range wireless transceivers 220, the satellite signal receiver 230, the one or more processors 232, memory 240, and/or oscillator algorithm 242, any or all of which may be considered means for performing this operation. In an aspect, where the electronic device is a base station, operation 430 may be performed by the one or more WWAN transceivers 250, the one or more short-range wireless transceivers 260, the satellite signal receiver 270, the one or more processors 284, memory 286, and/or oscillator algorithm 288, any or all of which may be considered means for performing this operation. In an aspect, where the electronic device is a network entity, operation 430 may be performed by the one or more network transceivers 290, the one or more processors 294, memory 296, and/or oscillator algorithm 298, any or all of which may be considered means for performing this operation.

At 440, the electronic device (e.g., oscillator frequency estimation algorithm block 340) determines the frequency error estimate of the oscillator based on the set of parameters. In an aspect, where the electronic device is a UE, operation 440 may be performed by the one or more WWAN transceivers 210, the one or more short-range wireless transceivers 220, the satellite signal receiver 230, the one or more processors 232, memory 240, and/or oscillator algorithm 242, any or all of which may be considered means for performing this operation. In an aspect, where the electronic device is a base station, operation 440 may be performed by the one or more WWAN transceivers 250, the one or more short-range wireless transceivers 260, the satellite signal receiver 270, the one or more processors 284, memory 286, and/or oscillator algorithm 288, any or all of which may be considered means for performing this operation. In an aspect, where the electronic device is a network entity, operation 440 may be performed by the one or more network transceivers 290, the one or more processors 294, memory 296, and/or oscillator algorithm 298, any or all of which may be considered means for performing this operation.

As will be appreciated, a technical advantage of the method 400 is improved oscillator frequency error estimation based on oscillator temperature measurements. For example, in a GNSS device, the performance improvements may include higher GNSS sensitivity and therefore improved location accuracy performance, improved data decoding performance, leading to faster time-to-first-fix, and improved carrier phase tracking, leading to improved location accuracy and improved availability of precise positioning. An improved algorithm can also better estimate the oscillator frequency error in high thermal transient conditions, thus allowing for more hardware compacted devices.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A method of oscillator frequency error estimation performed by an electronic device, comprising: receiving, from a power management integrated circuit (PMIC), a plurality of temperature measurements of an oscillator of the electronic device; determining a temperature noise level estimate of the oscillator based on the plurality of temperature measurements; determining, based on the temperature noise level estimate, a set of parameters for determining a frequency error estimate of the oscillator; and determining the frequency error estimate of the oscillator based on the set of parameters.

Clause 2. The method of clause 1, wherein determining the temperature noise level estimate of the oscillator comprises: determining a set of differential temperature values based on at least the plurality of temperature measurements; and determining a set of differential variances based on at least a filter weight applied to the set of differential temperature values.

Clause 3. The method of clause 2, wherein the set of differential temperature values is determined based on removing an estimate of actual temperature changes of the oscillator.

Clause 4. The method of any of clauses 2 to 3, wherein the set of differential temperature values is based on an average of the plurality of temperature measurements.

Clause 5. The method of any of clauses 2 to 4, wherein each differential temperature value of the set of differential temperature values is determined as: $DT(n)=(1/m)*(T(n)-T(n-m))-(T(n-\text{floor}(m/2))-T(n-\text{ceil}(m/2)))$, where m is a number of the plurality of temperature measurements, n is an index value of a temperature measurement of the plurality of temperature measurements, $T(n)$ is a temperature measurement at the index value n, and $DT(n)$ is a differential temperature value at the index value n.

Clause 6. The method of any of clauses 2 to 5, wherein each differential variance of the set of differential variances is determined as: $DVar(n)=(1-w)*DVar(n-1)+w*(DT(n)*DT(n))$, where n is an index value of a temperature measurement of the plurality of temperature measurements, w is the filter weight, $DT(n)$ is a differential temperature value at the index value n, $DVar(n)$ is a differential variance at the index value n, and $DVar(n-1)$ is the differential variance at the index value n−1.

Clause 7. The method of any of clauses 2 to 6, wherein the filter weight is configured according to a convergence mode, a tracking mode, or both.

Clause 8. The method of clause 7, wherein: the filter weight is configured according to the convergence mode for an initial period of time after bootup of the electronic device, and the filter weight is configured according to the tracking mode after the initial period of time after bootup of the electronic device.

Clause 9. The method of any of clauses 7 to 8, wherein a value of the filter weight is larger for the convergence mode than for the tracking mode.

Clause 10. The method of any of clauses 1 to 9, wherein the set of parameters for determining the frequency error estimate of the oscillator comprises a subset of parameters determined based on a feedback filter being applied to a frequency-temperature curve output of the oscillator.

Clause 11. The method of clause 10, wherein each parameter of the set of parameters determined based on the feedback filter is determined as: Value_new=Value_old+filter_coeff*(Raw_value−Value_old), where Value_old is a previous value of the parameter, Raw_value is a current instantaneous estimated value of the parameter, Value_new is a current value of the parameter, and filter_coeff is a filter coefficient of the feedback filter.

Clause 12. The method of any of clauses 10 to 11, wherein a filter mode of the feedback filter is based on a value of a filter coefficient of the feedback filter.

Clause 13. The method of clause 12, wherein lower values of the filter coefficient configure the feedback filter to operate faster than higher values of the filter coefficient.

Clause 14. The method of any of clauses 10 to 13, further comprising: combining the set of parameters determined based on the feedback filter with filter weights used to determine a set of differential variances based on the plurality of temperature measurements.

Clause 15. The method of clause 14, wherein more filter weights are allocated to the set of parameters determined based on the feedback filter based on the temperature noise level estimate being below a threshold than based on the temperature noise level estimate being above the threshold.

Clause 16. The method of any of clauses 1 to 15, wherein: the temperature noise level estimate is determined by an on-device oscillator temperature noise level estimation module, and the set of parameters is determined by the on-device oscillator temperature noise level estimation module.

Clause 17. The method of any of clauses 1 to 16, wherein the frequency error estimate is determined by an oscillator frequency estimation algorithm module.

Clause 18. The method of any of clauses 1 to 17, wherein the oscillator is a crystal oscillator or a micro-electromechanical system (MEMS) oscillator.

Clause 19. The method of any of clauses 1 to 18, further comprising: sending the frequency error estimate to a hardware subsystem of the electronic device.

Clause 20. The method of clause 19, wherein the hardware subsystem is a global navigation satellite system (GNSS) of the electronic device.

Clause 21. An electronic device, comprising: a memory; at least one transceiver; and at least one processor communicatively coupled to the memory and the at least one transceiver, the at least one processor configured to: receive, via the at least one transceiver, from a power management integrated circuit (PMIC), a plurality of temperature measurements of an oscillator of the electronic device; determine a temperature noise level estimate of the oscillator based on the plurality of temperature measurements; determine, based on the temperature noise level estimate, a set of parameters for determining a frequency error estimate of the oscillator; and determine the frequency error estimate of the oscillator based on the set of parameters.

Clause 22. The electronic device of clause 21, wherein the at least one processor configured to determine the temperature noise level estimate of the oscillator comprises the at least one processor configured to: determine a set of differential temperature values based on at least the plurality of temperature measurements; and determine a set of differential variances based on at least a filter weight applied to the set of differential temperature values.

Clause 23. The electronic device of clause 22, wherein the set of differential temperature values is determined based on removing an estimate of actual temperature changes of the oscillator.

Clause 24. The electronic device of any of clauses 22 to 23, wherein the set of differential temperature values is based on an average of the plurality of temperature measurements.

Clause 25. The electronic device of any of clauses 22 to 24, wherein each differential temperature value of the set of differential temperature values is determined as: $DT(n)=(1/m)*(T(n)-T(n-m))-(T(n-\text{floor}(m/2))-T(n-\text{ceil}(m/2)))$, where m is a number of the plurality of temperature measurements, n is an index value of a temperature measurement of the plurality of temperature measurements, $T(n)$ is a temperature measurement at the index value n, and $DT(n)$ is a differential temperature value at the index value n.

Clause 26. The electronic device of any of clauses 22 to 25, wherein each differential variance of the set of differential variances is determined as: $DVar(n)=(1-w)*DVar(n-1)+w*(DT(n)*DT(n))$, where n is an index value of a temperature measurement of the plurality of temperature measurements, w is the filter weight, $DT(n)$ is a differential temperature value at the index value n, $DVar(n)$ is a differential variance at the index value n, and $DVar(n-1)$ is the differential variance at the index value n-1.

Clause 27. The electronic device of any of clauses 22 to 26, wherein the filter weight is configured according to a convergence mode, a tracking mode, or both.

Clause 28. The electronic device of clause 27, wherein: the filter weight is configured according to the convergence mode for an initial period of time after bootup of the electronic device, and the filter weight is configured according to the tracking mode after the initial period of time after bootup of the electronic device.

Clause 29. The electronic device of any of clauses 27 to 28, wherein a value of the filter weight is larger for the convergence mode than for the tracking mode.

Clause 30. The electronic device of any of clauses 21 to 29, wherein the set of parameters for determining the frequency error estimate of the oscillator comprises a subset of parameters determined based on a feedback filter being applied to a frequency-temperature curve output of the oscillator.

Clause 31. The electronic device of clause 30, wherein each parameter of the set of parameters determined based on the feedback filter is determined as: Value_new=Value_old+filter_coeff*(Raw_value−Value_old), where Value_old is a previous value of the parameter, Raw_value is a current instantaneous estimated value of the parameter, Value_new is a current value of the parameter, and filter_coeff is a filter coefficient of the feedback filter.

Clause 32. The electronic device of any of clauses 30 to 31, wherein a filter mode of the feedback filter is based on a value of a filter coefficient of the feedback filter.

Clause 33. The electronic device of clause 32, wherein lower values of the filter coefficient configure the feedback filter to operate faster than higher values of the filter coefficient.

Clause 34. The electronic device of any of clauses 30 to 33, wherein the at least one processor is further configured to: combine the set of parameters determined based on the feedback filter with filter weights used to determine a set of differential variances based on the plurality of temperature measurements.

Clause 35. The electronic device of clause 34, wherein more filter weights are allocated to the set of parameters determined based on the feedback filter based on the temperature noise level estimate being below a threshold than based on the temperature noise level estimate being above the threshold.

Clause 36. The electronic device of any of clauses 21 to 35, wherein: the temperature noise level estimate is determined by an on-device oscillator temperature noise level estimation module, and the set of parameters is determined by the on-device oscillator temperature noise level estimation module.

Clause 37. The electronic device of any of clauses 21 to 36, wherein the frequency error estimate is determined by an oscillator frequency estimation algorithm module.

Clause 38. The electronic device of any of clauses 21 to 37, wherein the oscillator is a crystal oscillator or a micro-electromechanical system (MEMS) oscillator.

Clause 39. The electronic device of any of clauses 21 to 38, wherein the at least one processor is further configured to: send, via the at least one transceiver, the frequency error estimate to a hardware subsystem of the electronic device.

Clause 40. The electronic device of clause 39, wherein the hardware subsystem is a global navigation satellite system (GNSS) of the electronic device.

Clause 41. An electronic device, comprising: means for receiving, from a power management integrated circuit (PMIC), a plurality of temperature measurements of an oscillator of the electronic device; means for determining a temperature noise level estimate of the oscillator based on the plurality of temperature measurements; means for determining, based on the temperature noise level estimate, a set of parameters for determining a frequency error estimate of the oscillator; and means for determining the frequency error estimate of the oscillator based on the set of parameters.

Clause 42. The electronic device of clause 41, wherein the means for determining the temperature noise level estimate of the oscillator comprises: means for determining a set of differential temperature values based on at least the plurality of temperature measurements; and means for determining a set of differential variances based on at least a filter weight applied to the set of differential temperature values.

Clause 43. The electronic device of clause 42, wherein the set of differential temperature values is determined based on removing an estimate of actual temperature changes of the oscillator.

Clause 44. The electronic device of any of clauses 42 to 43, wherein the set of differential temperature values is based on an average of the plurality of temperature measurements.

Clause 45. The electronic device of any of clauses 42 to 44, wherein each differential temperature value of the set of differential temperature values is determined as: $DT(n)=(1/m)*(T(n)-T(n-m))-(T(n-floor(m/2))-T(n-ceil(m/2)))$, where m is a number of the plurality of temperature measurements, n is an index value of a temperature measurement of the plurality of temperature measurements, $T(n)$ is a temperature measurement at the index value n, and $DT(n)$ is a differential temperature value at the index value n.

Clause 46. The electronic device of any of clauses 42 to 45, wherein each differential variance of the set of differential variances is determined as: $DVar(n)=(1-w)*DVar(n-1)+w*(DT(n)*DT(n))$, where n is an index value of a temperature measurement of the plurality of temperature measurements, w is the filter weight, $DT(n)$ is a differential temperature value at the index value n, $DVar(n)$ is a differential variance at the index value n, and $DVar(n-1)$ is the differential variance at the index value n−1.

Clause 47. The electronic device of any of clauses 42 to 46, wherein the filter weight is configured according to a convergence mode, a tracking mode, or both.

Clause 48. The electronic device of clause 47, wherein: the filter weight is configured according to the convergence mode for an initial period of time after bootup of the electronic device, and the filter weight is configured according to the tracking mode after the initial period of time after bootup of the electronic device.

Clause 49. The electronic device of any of clauses 47 to 48, wherein a value of the filter weight is larger for the convergence mode than for the tracking mode.

Clause 50. The electronic device of any of clauses 41 to 49, wherein the set of parameters for determining the frequency error estimate of the oscillator comprises a subset of parameters determined based on a feedback filter being applied to a frequency-temperature curve output of the oscillator.

Clause 51. The electronic device of clause 50, wherein each parameter of the set of parameters determined based on the feedback filter is determined as: Value_new=Value_old+filter_coeff*(Raw_value−Value_old), where Value_old is a previous value of the parameter, Raw_value is a current instantaneous estimated value of the parameter, Value_new is a current value of the parameter, and filter_coeff is a filter coefficient of the feedback filter.

Clause 52. The electronic device of any of clauses 50 to 51, wherein a filter mode of the feedback filter is based on a value of a filter coefficient of the feedback filter.

Clause 53. The electronic device of clause 52, wherein lower values of the filter coefficient configure the feedback filter to operate faster than higher values of the filter coefficient.

Clause 54. The electronic device of any of clauses 50 to 53, further comprising: means for combining the set of parameters determined based on the feedback filter with filter weights used to determine a set of differential variances based on the plurality of temperature measurements.

Clause 55. The electronic device of clause 54, wherein more filter weights are allocated to the set of parameters determined based on the feedback filter based on the temperature noise level estimate being below a threshold than based on the temperature noise level estimate being above the threshold.

Clause 56. The electronic device of any of clauses 41 to 55, wherein: the temperature noise level estimate is determined by an on-device oscillator temperature noise level estimation module, and the set of parameters is determined by the on-device oscillator temperature noise level estimation module.

Clause 57. The electronic device of any of clauses 41 to 56, wherein the frequency error estimate is determined by an oscillator frequency estimation algorithm module.

Clause 58. The electronic device of any of clauses 41 to 57, wherein the oscillator is a crystal oscillator or a micro-electromechanical system (MEMS) oscillator.

Clause 59. The electronic device of any of clauses 41 to 58, further comprising: means for sending the frequency error estimate to a hardware subsystem of the electronic device.

Clause 60. The electronic device of clause 59, wherein the hardware subsystem is a global navigation satellite system (GNSS) of the electronic device.

Clause 61. A non-transitory computer-readable medium storing computer-executable instructions that, when executed by an electronic device, cause the electronic device to: receive, from a power management integrated circuit (PMIC), a plurality of temperature measurements of an oscillator of the electronic device; determine a temperature noise level estimate of the oscillator based on the plurality of temperature measurements; determine, based on the temperature noise level estimate, a set of parameters for determining a frequency error estimate of the oscillator; and determine the frequency error estimate of the oscillator based on the set of parameters.

Clause 62. The non-transitory computer-readable medium of clause 61, wherein the computer-executable instructions that, when executed by the electronic device, cause the electronic device to determine the temperature noise level estimate of the oscillator comprise computer-executable instructions that, when executed by the electronic device, cause the electronic device to: determine a set of differential temperature values based on at least the plurality of temperature measurements; and determine a set of differential variances based on at least a filter weight applied to the set of differential temperature values.

Clause 63. The non-transitory computer-readable medium of clause 62, wherein the set of differential temperature values is determined based on removing an estimate of actual temperature changes of the oscillator.

Clause 64. The non-transitory computer-readable medium of any of clauses 62 to 63, wherein the set of differential temperature values is based on an average of the plurality of temperature measurements.

Clause 65. The non-transitory computer-readable medium of any of clauses 62 to 64, wherein each differential temperature value of the set of differential temperature values is determined as: $DT(n)=(1/m)*(T(n)-T(n-m))-(T(n-floor(m/2))-T(n-ceil(m/2)))$, where m is a number of the plurality of temperature measurements, n is an index value of a temperature measurement of the plurality of temperature measurements, $T(n)$ is a temperature measurement at the index value n, and $DT(n)$ is a differential temperature value at the index value n.

Clause 66. The non-transitory computer-readable medium of any of clauses 62 to 65, wherein each differential variance of the set of differential variances is determined as: $DVar(n)=(1-w)*DVar(n-1)+w*(DT(n)*DT(n))$, where n is an index value of a temperature measurement of the plurality of temperature measurements, w is the filter weight, $DT(n)$ is a differential temperature value at the index value n, $DVar(n)$ is a differential variance at the index value n, and $DVar(n-1)$ is the differential variance at the index value n−1.

Clause 67. The non-transitory computer-readable medium of any of clauses 62 to 66, wherein the filter weight is configured according to a convergence mode, a tracking mode, or both.

Clause 68. The non-transitory computer-readable medium of clause 67, wherein: the filter weight is configured according to the convergence mode for an initial period of time after bootup of the electronic device, and the filter weight is configured according to the tracking mode after the initial period of time after bootup of the electronic device.

Clause 69. The non-transitory computer-readable medium of any of clauses 67 to 68, wherein a value of the filter weight is larger for the convergence mode than for the tracking mode.

Clause 70. The non-transitory computer-readable medium of any of clauses 61 to 69, wherein the set of parameters for determining the frequency error estimate of the oscillator comprises a subset of parameters determined based on a feedback filter being applied to a frequency-temperature curve output of the oscillator.

Clause 71. The non-transitory computer-readable medium of clause 70, wherein each parameter of the set of parameters determined based on the feedback filter is determined as: Value_new=Value_old+filter_coeff*(Raw_value−Value_old), where Value_old is a previous value of the parameter, Raw_value is a current instantaneous estimated value of the parameter, Value_new is a current value of the parameter, and filter_coeff is a filter coefficient of the feedback filter.

Clause 72. The non-transitory computer-readable medium of any of clauses 70 to 71, wherein a filter mode of the feedback filter is based on a value of a filter coefficient of the feedback filter.

Clause 73. The non-transitory computer-readable medium of clause 72, wherein lower values of the filter coefficient configure the feedback filter to operate faster than higher values of the filter coefficient.

Clause 74. The non-transitory computer-readable medium of any of clauses 70 to 73, further comprising computer-executable instructions that, when executed by the electronic device, cause the electronic device to: combine the set of parameters determined based on the feedback filter with filter weights used to determine a set of differential variances based on the plurality of temperature measurements.

Clause 75. The non-transitory computer-readable medium of clause 74, wherein more filter weights are allocated to the set of parameters determined based on the feedback filter based on the temperature noise level estimate being below a threshold than based on the temperature noise level estimate being above the threshold.

Clause 76. The non-transitory computer-readable medium of any of clauses 61 to 75, wherein: the temperature noise level estimate is determined by an on-device oscillator temperature noise level estimation module, and the set of parameters is determined by the on-device oscillator temperature noise level estimation module.

Clause 77. The non-transitory computer-readable medium of any of clauses 61 to 76, wherein the frequency error estimate is determined by an oscillator frequency estimation algorithm module.

Clause 78. The non-transitory computer-readable medium of any of clauses 61 to 77, wherein the oscillator is a crystal oscillator or a micro-electromechanical system (MEMS) oscillator.

Clause 79. The non-transitory computer-readable medium of any of clauses 61 to 78, further comprising computer-executable instructions that, when executed by the electronic device, cause the electronic device to: send the frequency error estimate to a hardware subsystem of the electronic device.

Clause 80. The non-transitory computer-readable medium of clause 79, wherein the hardware subsystem is a global navigation satellite system (GNSS) of the electronic device.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a digital signal processor (DSP), an ASIC, a field-programable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A method of oscillator frequency error estimation performed by an electronic device, comprising:
   receiving, from a power management integrated circuit (PMIC), a plurality of temperature measurements of an oscillator of the electronic device;
   determining a temperature noise level estimate of the oscillator based on the plurality of temperature measurements;
   determining, based on the temperature noise level estimate, a set of parameters for determining a frequency error estimate of the oscillator; and
   determining the frequency error estimate of the oscillator based on the set of parameters;
   wherein determining the temperature noise level estimate of the oscillator comprises:
      determining a set of differential temperature values based on at least the plurality of temperature measurements; and
      determining a set of differential variances based on at least a filter weight applied to the set of differential temperature values.

2. The method of claim 1, wherein the set of differential temperature values is determined based on removing an estimate of actual temperature changes of the oscillator.

3. The method of claim 1, wherein the set of differential temperature values is based on an average of the plurality of temperature measurements.

4. The method of claim 1, wherein each differential temperature value of the set of differential temperature values is determined as:

$$DT(n)=(1/m)*(T(n)-T(n-m))-(T(n-\text{floor}(m/2))-T(n-\text{ceil}(m/2))$$

where m is a number of the plurality of temperature measurements, n is an index value of a temperature measurement of the plurality of temperature measurements, T(n) is a temperature measurement at the index value n, and DT(n) is a differential temperature value at the index value n.

5. The method of claim 1, wherein each differential variance of the set of differential variances is determined as:

$$DVar(n)=(1-w)*DVar(n-1)+w*(DT(n)*DT(n)),$$

where n is an index value of a temperature measurement of the plurality of temperature measurements, w is the filter weight, DT(n) is a differential temperature value at the index value n, DVar(n) is a differential variance at the index value n, and DVar(n−1) is the differential variance at the index value n−1.

6. The method of claim 1, wherein the filter weight is configured according to a convergence mode, a tracking mode, or both.

7. The method of claim 6, wherein:
the filter weight is configured according to the convergence mode for an initial period of time after bootup of the electronic device, and
the filter weight is configured according to the tracking mode after the initial period of time after bootup of the electronic device.

8. The method of claim 6, wherein a value of the filter weight is larger for the convergence mode than for the tracking mode.

9. The method of claim 1, wherein the set of parameters for determining the frequency error estimate of the oscillator comprises a subset of parameters determined based on a feedback filter being applied to a frequency-temperature curve output of the oscillator.

10. The method of claim 9, wherein each parameter of the set of parameters determined based on the feedback filter is determined as:

Value new=Value_old+filter_coeff*(Raw_value−Value_old), where Value_old is a previous value of the parameter, Raw_value is a current instantaneous estimated value of the parameter, Value_new is a current value of the parameter, and filter_coeff is a filter coefficient of the feedback filter.

11. The method of claim 9, wherein a filter mode of the feedback filter is based on a value of a filter coefficient of the feedback filter.

12. The method of claim 11, wherein lower values of the filter coefficient configure the feedback filter to operate faster than higher values of the filter coefficient.

13. The method of claim 9, further comprising:
combining the set of parameters determined based on the feedback filter with filter weights used to determine a set of differential variances based on the plurality of temperature measurements.

14. The method of claim 13, wherein more filter weights are allocated to the set of parameters determined based on the feedback filter based on the temperature noise level estimate being below a threshold than based on the temperature noise level estimate being above the threshold.

15. The method of claim 1, wherein:
the temperature noise level estimate is determined by an on-device oscillator temperature noise level estimation module, and
the set of parameters is determined by the on-device oscillator temperature noise level estimation module.

16. The method of claim 1, wherein the frequency error estimate is determined by an oscillator frequency estimation algorithm module.

17. The method of claim 1, wherein the oscillator is a crystal oscillator or a micro-electromechanical system (MEMS) oscillator.

18. The method of claim 1, further comprising:
sending the frequency error estimate to a hardware subsystem of the electronic device.

19. The method of claim 18, wherein the hardware subsystem is a global navigation satellite system (GNSS) of the electronic device.

20. An electronic device, comprising:
a memory;
at least one transceiver; and
at least one processor communicatively coupled to the memory and the at least one transceiver, the at least one processor configured to:
receive, via the at least one transceiver, from a power management integrated circuit (PMIC), a plurality of temperature measurements of an oscillator of the electronic device;
determine a temperature noise level estimate of the oscillator based on the plurality of temperature measurements;
determine, based on the temperature noise level estimate, a set of parameters for determining a frequency error estimate of the oscillator; and
determine the frequency error estimate of the oscillator based on the set of parameters;
wherein the at least one processor configured to determine the temperature noise level estimate of the oscillator comprises the at least one processor configured to:
determine a set of differential temperature values based on at least the plurality of temperature measurements; and
determine a set of differential variances based on at least a filter weight applied to the set of differential temperature values.

21. The electronic device of claim 20, wherein the set of differential temperature values is determined based on removing an estimate of actual temperature changes of the oscillator.

22. The electronic device of claim 20, wherein the set of differential temperature values is based on an average of the plurality of temperature measurements.

23. The electronic device of claim 20, wherein each differential temperature value of the set of differential temperature values is determined as:

$$DT(n)=(1/m)*(T(n)-T(n-m))-(T(n-\text{floor}(m/2))-T(n-\text{ceil}(m/2))$$

where m is a number of the plurality of temperature measurements, n is an index value of a temperature measurement of the plurality of temperature measurements, T(n) is a temperature measurement at the index value n, and DT(n) is a differential temperature value at the index value n.

24. The electronic device of claim 20, wherein each differential variance of the set of differential variances is determined as:

$$DVar(n)=(1-w)*DVar(n-1)+w*(DT(n)*DT(n)),$$

where n is an index value of a temperature measurement of the plurality of temperature measurements, w is the filter weight, DT(n) is a differential temperature value at the index value n, DVar(n) is a differential variance at the index value n, and DVar(n−1) is the differential variance at the index value n−1.

25. The electronic device of claim 20, wherein the filter weight is configured according to a convergence mode, a tracking mode, or both.

26. The electronic device of claim 25, wherein: the filter weight is configured according to the convergence mode for an initial period of time after bootup of the electronic device, and the filter weight is configured according to the tracking mode after the initial period of time after bootup of the electronic device.

27. The electronic device of claim 25, wherein a value of the filter weight is larger for the convergence mode than for the tracking mode.

28. The electronic device of claim 20, wherein the set of parameters for determining the frequency error estimate of the oscillator comprises a subset of parameters determined based on a feedback filter being applied to a frequency-temperature curve output of the oscillator.

29. The electronic device of claim 28, wherein each parameter of the set of parameters determined based on the feedback filter is determined as: Valuenew=Valueold+filter_coeff*(Rawvalue−Value old), where Valueold is a previous value of the parameter, Rawvalue is a current instantaneous estimated value of the parameter, Valuenew is a current value of the parameter, and filtercoeff is a filter coefficient of the feedback filter.

30. The electronic device of claim 29, wherein a filter mode of the feedback filter is based on a value of a filter coefficient of the feedback filter.

31. The electronic device of claim 30, wherein lower values of the filter coefficient configure the feedback filter to operate faster than higher values of the filter coefficient.

32. The electronic device of claim 28, wherein the at least one processor is further configured to: combine the set of parameters determined based on the feedback filter with filter weights used to determine a set of differential variances based on the plurality of temperature measurements.

33. The electronic device of claim 28, wherein more filter weights are allocated to the set of parameters determined based on the feedback filter based on the temperature noise level estimate being below a threshold than based on the temperature noise level estimate being above the threshold.

34. The electronic device of claim 20, wherein: the temperature noise level estimate is determined by an on-device oscillator temperature noise level estimation module, and the set of parameters is determined by the on-device oscillator temperature noise level estimation module.

35. The electronic device of claim 20, wherein the frequency error estimate is determined by an oscillator frequency estimation algorithm module.

36. The electronic device of claim 20, wherein the oscillator is a crystal oscillator or a micro-electromechanical system (MEMS) oscillator.

37. The electronic device of claim 20, wherein the at least one processor is further configured to: send, via the at least one transceiver, the frequency error estimate to a hardware subsystem of the electronic device.

38. The electronic device of claim 37, wherein the hardware subsystem is a global navigation satellite system (GNSS) of the electronic device.

39. An electronic device, comprising:
means for receiving, from a power management integrated circuit (PMIC), a plurality of temperature measurements of an oscillator of the electronic device;
means for determining a temperature noise level estimate of the oscillator based on the plurality of temperature measurements;
means for determining, based on the temperature noise level estimate, a set of parameters for determining a frequency error estimate of the oscillator; and
means for determining the frequency error estimate of the oscillator based on the set of parameters;
wherein the means for determining the temperature noise level estimate of the oscillator comprises:
means for determining a set of differential temperature values based on at least the plurality of temperature measurements; and
means for determining a set of differential variances based on at least a filter weight applied to the set of differential temperature values.

40. A non-transitory computer-readable medium storing computer-executable instructions that, when executed by an electronic device, cause the electronic device to:
receive, from a power management integrated circuit (PMIC), a plurality of temperature measurements of an oscillator of the electronic device;
determine a temperature noise level estimate of the oscillator based on the plurality of temperature measurements;
determine, based on the temperature noise level estimate, a set of parameters for determining a frequency error estimate of the oscillator; and
determine the frequency error estimate of the oscillator based on the set of parameters, Location;
wherein determining the temperature noise level estimate of the oscillator comprises:
determining a set of differential temperature values based on at least the plurality of temperature measurements; and
determining a set of differential variances based on at least a filter weight applied to the set of differential temperature values.

* * * * *